United States Patent
Kim et al.

(10) Patent No.: US 10,381,078 B2
(45) Date of Patent: Aug. 13, 2019

(54) SEMICONDUCTOR MEMORIES AND METHODS FOR MANUFACTURING SAME

(71) Applicant: Samsung Electronics Co., Ltd., Suwon-si, Gyeonggi-do (KR)

(72) Inventors: Chanho Kim, Seoul (KR); Dong-Kil Yun, Hwaseong-si (KR); Pansuk Kwak, Seoul (KR); Hongsoo Jeon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/992,840

(22) Filed: May 30, 2018

(65) Prior Publication Data

US 2019/0130974 A1  May 2, 2019

(30) Foreign Application Priority Data

Oct. 26, 2017  (KR) .......................... 10-2017-0140362

(51) Int. Cl.
*G11C 14/00* (2006.01)
*H01L 27/11578* (2017.01)
(Continued)

(52) U.S. Cl.
CPC .... *G11C 14/0018* (2013.01); *H01L 27/10808* (2013.01); *H01L 27/10847* (2013.01);
(Continued)

(58) Field of Classification Search
CPC ............ G11C 14/0018; G11C 11/4091; G11C 11/4094; G11C 11/4087; G11C 16/0483;
(Continued)

(56) References Cited

U.S. PATENT DOCUMENTS 7,079,148 B2 * 7/2006 Sharma ................. B82Y 10/00
257/E21.665
8,391,078 B2 * 3/2013 Leung ................... G11C 11/404
365/185.05

(Continued)

FOREIGN PATENT DOCUMENTS

KR  10-1410797 B1  6/2014

*Primary Examiner* — Fernando Hidalgo
(74) *Attorney, Agent, or Firm* — Harness, Dickey & Pierce, P.L.C.

(57) ABSTRACT

A semiconductor memory includes a first memory cell array in a first region of a substrate and a second memory cell array in a second region of the substrate. The first memory cell array includes cell strings, and each cell string includes non-volatile memory cells stacked in a direction perpendicular to the substrate. The second memory cell array includes volatile memory cells, and each volatile memory cell includes a select transistor and a capacitor. The capacitor includes at least one contact electrically connected with the select transistor and having a second height corresponding to a first height of each cell string, and at least one second contact supplied with a ground voltage, having a third height corresponding to the first height of each cell string, adjacent to the at least one first contact, and electrically disconnected with the at least one first contact.

20 Claims, 19 Drawing Sheets

(51) Int. Cl.
*H01L 27/108* (2006.01)
*H01L 27/1157* (2017.01)
*G11C 11/4094* (2006.01)
*G11C 11/408* (2006.01)
*G11C 16/08* (2006.01)
*G11C 16/10* (2006.01)
*G11C 16/26* (2006.01)
*G11C 11/4091* (2006.01)
*G11C 16/04* (2006.01)

(52) U.S. Cl.
CPC .... *H01L 27/1157* (2013.01); *H01L 27/11578* (2013.01); *G11C 11/4087* (2013.01); *G11C 11/4091* (2013.01); *G11C 11/4094* (2013.01); *G11C 16/0483* (2013.01); *G11C 16/08* (2013.01); *G11C 16/10* (2013.01); *G11C 16/26* (2013.01)

(58) Field of Classification Search
CPC ......... G11C 16/26; G11C 16/10; G11C 16/08; H01L 27/1157; H01L 27/10808; H01L 27/10847; H01L 27/11578
USPC ................................................... 365/185.08
See application file for complete search history.

(56) References Cited

U.S. PATENT DOCUMENTS

| | | |
|---|---|---|
| 8,811,079 B2 | 8/2014 | Fukuda et al. |
| 9,208,883 B2 | 12/2015 | Alsmeier |
| 9,659,954 B2 | 5/2017 | Kim et al. |
| 9,666,596 B2 | 5/2017 | Takamatsu |
| 9,716,137 B1 | 7/2017 | Hu et al. |
| 10,199,227 B2 * | 2/2019 | Mayuzumi ........ H01L 29/66545 |
| 2014/0070295 A1 | 3/2014 | Fukuda et al. |
| 2016/0071591 A1 | 3/2016 | Hsu |
| 2017/0053932 A1 | 2/2017 | Jeon |
| 2017/0263458 A1 * | 9/2017 | Mayuzumi ........ H01L 29/66545 |

* cited by examiner

SEMICONDUCTOR MEMORIES AND METHODS FOR MANUFACTURING SAME

CROSS-REFERENCE TO RELATED APPLICATIONS

This application claims priority under 35 U.S.C. § 119 to Korean Patent Application No. 10-2017-0140362 filed Oct. 26, 2017, in the Korean Intellectual Property Office, the disclosures of which are incorporated by reference herein in their entireties.

BACKGROUND

Embodiments of the inventive concepts described herein relate to semiconductor circuits, and more particularly to semiconductor memories and methods for manufacturing same.

As semiconductor manufacturing technology advances, the integration of semiconductor memories has been improved. In particular, with the development in the manufacturing technology of semiconductor memories having a three dimensional (3D) structure, the integration of semiconductor memories has been rapidly improved. A semiconductor memory having a 3D structure includes a non-volatile memory, such as a flash memory, a phase change random access memory (PRAM), a ferroelectric RAM (FeRAM), or a resistive RAM (RRAM).

A semiconductor memory includes a core region having ("including") memory cells and a peripheral region having peripheral circuits for accessing ("configured to access") the memory cells. As the memory cells are stacked in a 3D structure, the difference in height between the core region and the peripheral region may be increased. As the difference in height between the core region and the peripheral region is increased, a void space is increased in the peripheral region.

SUMMARY

Example embodiments of the inventive concepts provide semiconductor memories including heterogeneous memory cells provided based on the differences in height between core regions and peripheral regions, which are made as memory cells are stacked in 3D structures, and methods for manufacturing the same.

According to some example embodiments, a semiconductor memory may include a first memory cell array on a first region of a substrate and a second memory cell array on a second region of the substrate. The first memory cell array may include a plurality of cell strings, each cell string of the plurality of cell strings including a plurality of non-volatile memory cells, the plurality of non-volatile memory cells stacked in a direction perpendicular to the substrate. The second memory cell array may include a plurality of volatile memory cells, each volatile memory cell of the plurality of volatile memory cells including a select transistor and a capacitor. The capacitor may include at least one first contact electrically connected with the select transistor of the volatile memory cell, the at least one first contact having a second height corresponding to a first height of each cell string of the plurality of cell strings, and at least one second contact configured to be supplied with a ground voltage, the at least one second contact having a third height corresponding to the first height of each cell string of the plurality of cell strings, the at least one second contact adjacent to the at least one first contact of the volatile memory cell, the at least one second contact electrically disconnected with the at least one first contact of the volatile memory cell.

According to some example embodiments, a semiconductor memory may include a memory cell array including a plurality of memory cells. Each memory cell of the plurality of memory cells may include a select transistor and a capacitor. The capacitor may include at least one first contact extending in a direction perpendicular to a substrate and connected with at least one junction of the select transistor of the memory cell, and at least one second contact adjacent to the at least one first contact, the at least one second contact configured to be supplied with a ground voltage, the at least one second contact electrically disconnected from the at least one first contact. The semiconductor memory may include a decoder connected with the plurality of memory cells through separate, respective word lines and a write driver and sense amplifier connected with the plurality of memory cells through respective bit lines.

According to some example embodiments, a method may include providing a first memory cell array on a substrate, the providing the first memory cell array including providing a plurality of cell strings on the substrate in a direction perpendicular to the substrate, each cell string including a separate stack of first memory cells of the first memory cell array. The method may include providing a second memory cell array on the substrate, the providing the second memory cell array including providing at least one first contact, the at least one first contact having a second height corresponding to a first height of each cell string of the plurality of cell strings, providing at least one second contact, the at least one second contact having a third height corresponding to the first height of each cell string of the plurality of cell strings, electrically connecting the at least one first contact with a select transistor, and electrically connecting the at least one second contact with a ground node.

BRIEF DESCRIPTION OF THE FIGURES

The above and other objects and features of the inventive concepts will become apparent by describing in detail example embodiments thereof with reference to the accompanying drawings.

DETAILED DESCRIPTION

Below, example embodiments of the inventive concepts will be described clearly and in detail with reference to accompanying drawings to such an extent that an ordinary one in the art implements example embodiments of the inventive concepts.

In the following description, the wording that a first element is connected with a second element may include the meaning that the first element is directly connected with the second element or that the first element is indirectly connected with the second element through the third element. For example, even if the third element is present between the first element and the second element, the first element may be described as being connected with the second element.

In the following description, the wording that the first element is electrically connected with the second element may include the meaning that the first element formed of a conductive material is connected with the second element formed of the conductive material or the meaning that the first element formed of the conductive material is indirectly connected with the second element formed of the conductive material through a third element formed of a conductive material.

Figure 1:
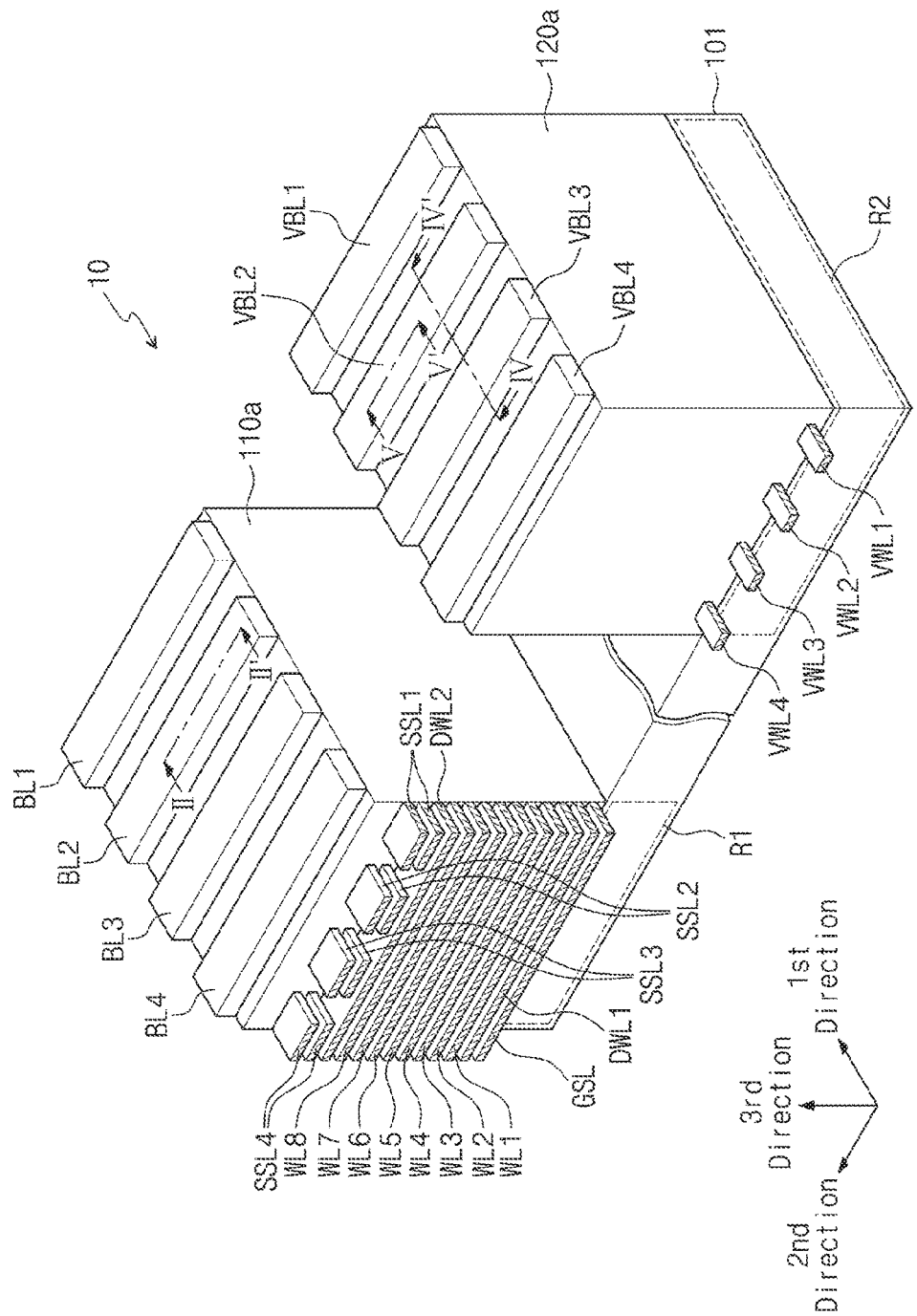
FIG. 1 is a perspective view illustrating memory cell arrays, according to some example embodiments of the inventive concepts.

FIG. 1 is a perspective view illustrating a semiconductor memory 10 including memory cell arrays 110a and 120a, according to some example embodiments of the inventive concepts. Referring to FIG. 1, the first memory cell array 110a and the second memory cell array 120a are formed on the same substrate 101 in first to third directions, such that the first memory cell array 110a is on a first region R1 of the substrate 101 and the second memory cell array 120a is on a separate, second region R2 of the substrate 101.

Figure 16:
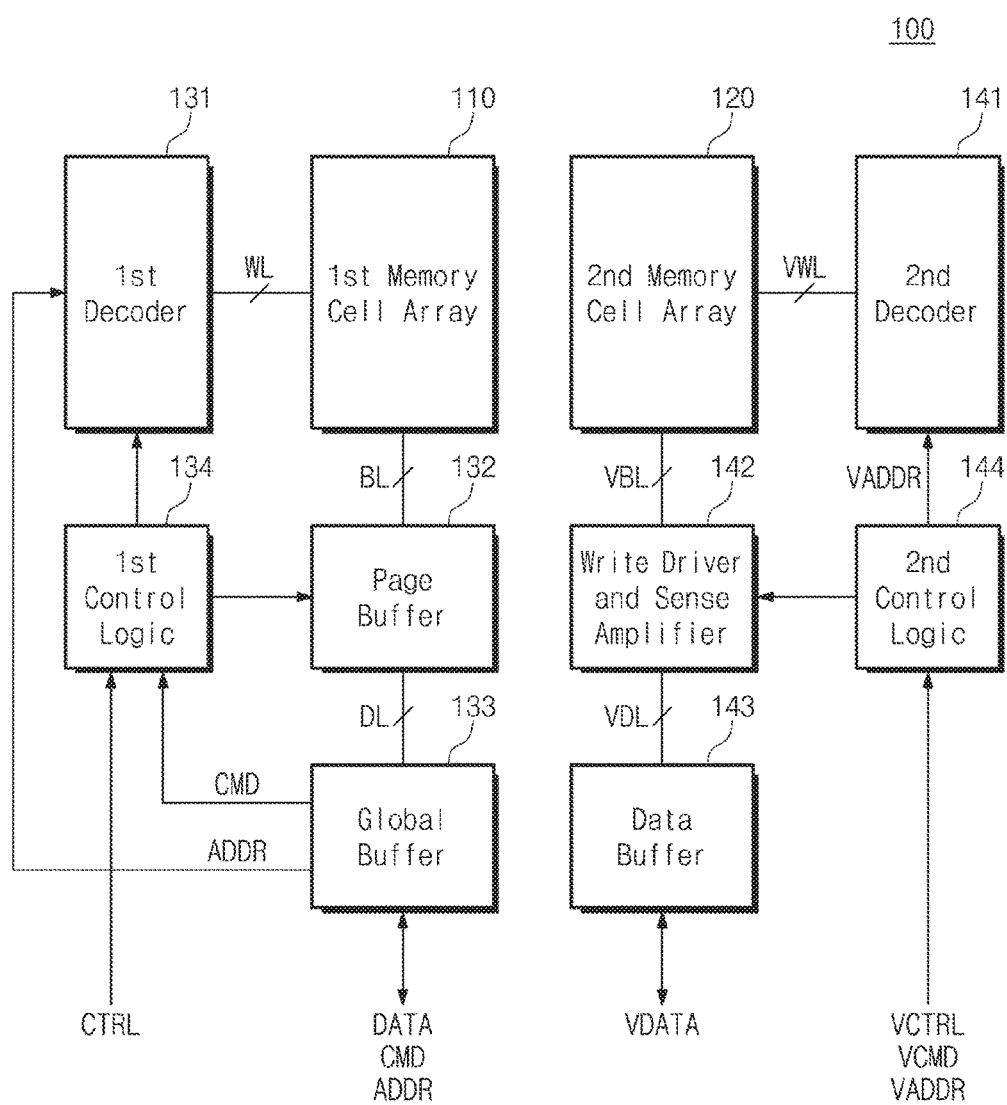
FIG. 16 is a block diagram illustrating a semiconductor memory including first and second memory cell arrays.

The first memory cell array 110a may be a part of a memory cell array (see 110 of FIG. 16). The first memory cell array 110a is connected with a ground select line GSL, a first dummy word line DWL1, first to eighth word lines WL1 to WL8, a second dummy word line DWL2, and first to fourth string select lines SSL1 to SSL4, which are stacked in the third direction perpendicular to the substrate 101 while extending in the first direction.

The first memory cell array 110a is connected with first to fourth bit lines BL1 to BL4 extending in the second direction. The number of various lines connected with the first memory cell array 110a illustrated in FIG. 1 is provided for the illustrative purpose. The number of the lines connected with the first memory cell array 110a is not limited.

The second memory cell array 120a may be a part of a memory cell array (see 120 of FIG. 16). The second memory cell array 120a is connected with the first to fourth word lines WL1 to WL4 extending in the first direction. The second memory cell array 120a is connected with first to fourth volatile bit lines VBL1 to VBL4 extending in the second direction. The number of various lines connected with the second memory cell array 120a illustrated in FIG. 1 is provided for the illustrative purpose. The number of the lines connected with the second memory cell array 120a is not limited.

The first memory cell array 110a may include non-volatile memory cells stacked in the third direction on the substrate 101. The second memory cell array 120a may include volatile memory cells implemented using the difference between heights of the non-volatile memory cells stacked in the first memory cell array 110a and heights of transistors in the second memory cell array 120a.

To prevent drawings from being unnecessarily complicated, the first memory cell array 110a and the second memory cell array 120b are illustrated in the shape of a simple hexahedron. Detailed elements of the first memory cell array 110a and the second memory cell array 120b will be described below in more detail with reference to FIGS. 2 to 5.

Figure 2:
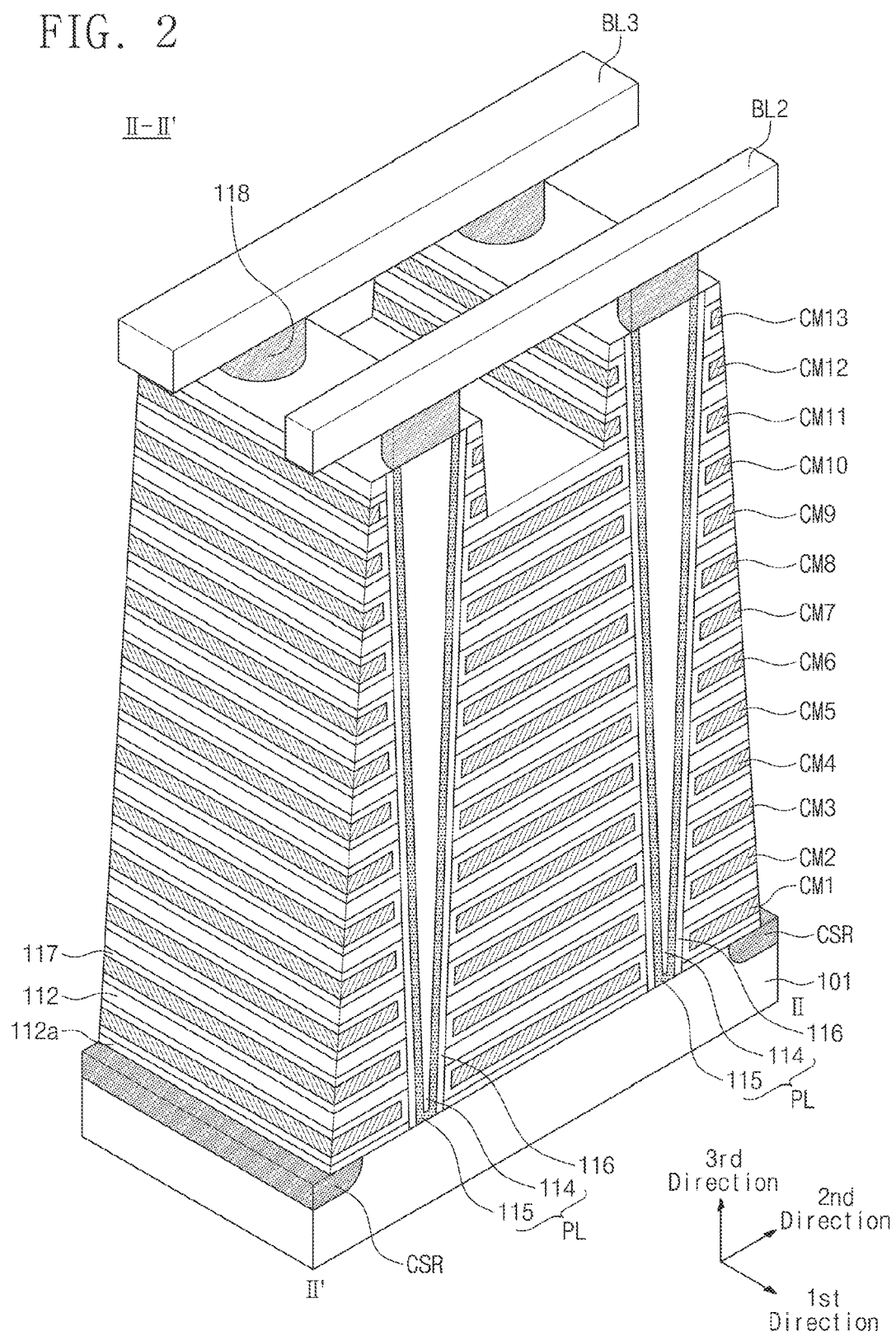
FIG. 2 is a perspective sectional view taken along line II-II' of a first memory cell array of FIG. 1.
Figure 3:
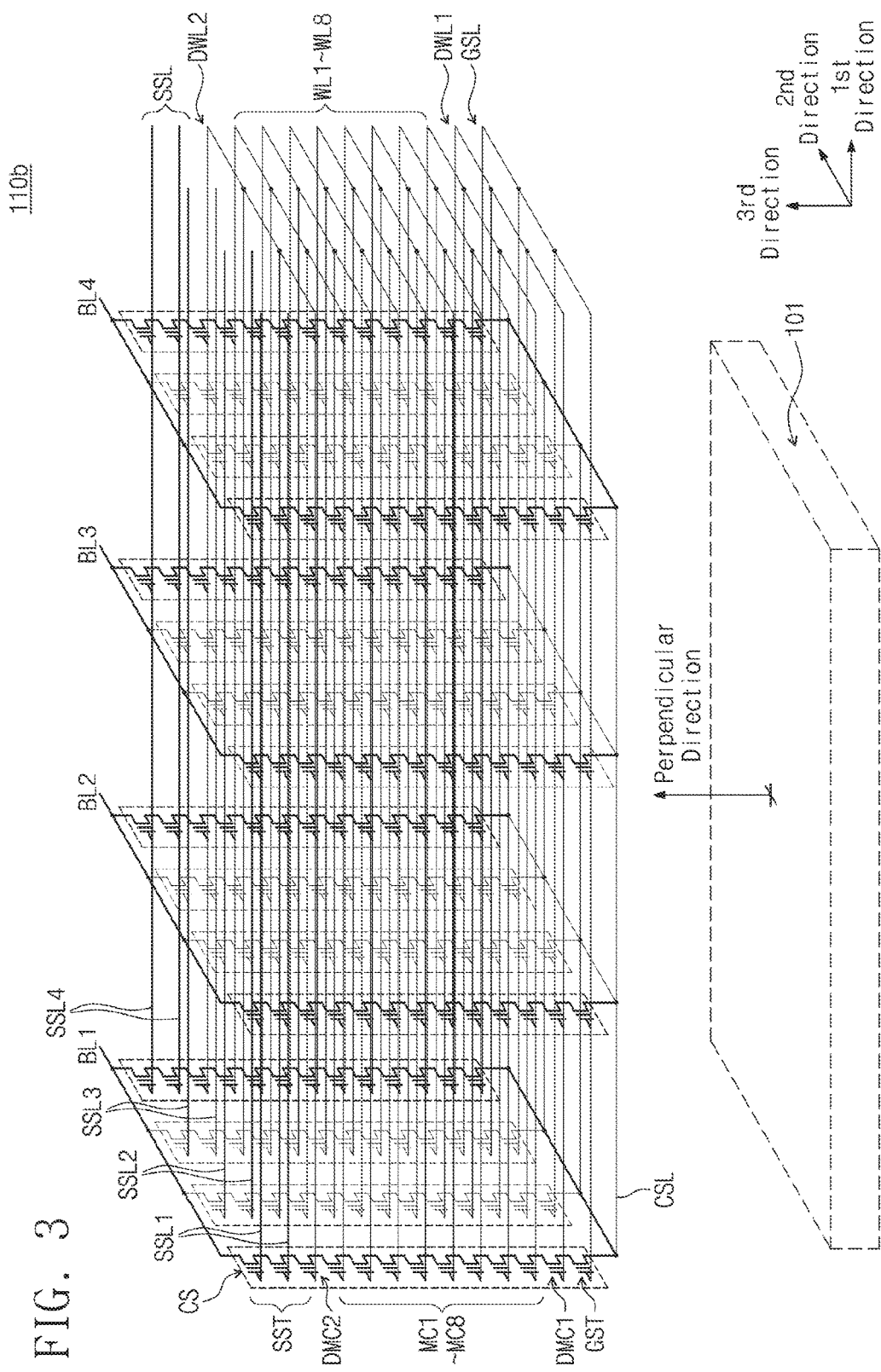
FIG. 3 is a circuit diagram of the first memory cell array of FIG. 1.

FIG. 2 is a perspective sectional view taken along line II-II' of the first memory cell array 110a of FIG. 1. FIG. 3 is a circuit diagram 110b of the first memory cell array 110a of FIG. 1. Referring to FIGS. 1 to 3, common source regions CSRs are provided on the substrate 101 while extending in the first direction and spaced apart from each other in the second direction.

The common source regions CSR are connected in common to form a common source line CSL. For example, the substrate 101 may include a semiconductor material having a P conductive type. The common source regions CSR may include a semiconductor material having an N conductive type. For example, a conductive material is disposed onto the common source regions CSR to increase the conductivity of the common source line CSL.

Insulating layers 112 and 112a are interposed between the common source regions CSR and are sequentially stacked on the substrate 101 in the third direction perpendicular to the substrate 101. The insulating layers 112 and 112a may be stacked while being spaced apart from each other in the third direction. For example, the insulating layers 112 and 112a may include a silicon oxide or a silicon nitride. For example, the thickness (for example, the thickness in the third direction) of the insulating layer 112a, which makes contact with the substrate 101, among the insulating layers 112 and 112a, may be thinner than that of each of other insulating layers 112 (for example, the thickness in the third direction)

Pillars PL are interposed between the common source regions CSR, are disposed to be spaced apart from each other in the first direction and the second direction, and pass through the insulating layers 112 and 112a in the third direction. For example, the pillars PL pass through the insulating layers 112 and 112a to make contact with the substrate 101. Each of the pillars PL may include an inner material 114, a channel film 115, and a first insulating film 116.

The inner material 114 may include an insulating material or an air gap. The channel film 115 may include a semiconductor material having a P conductive type or an intrinsic semiconductor material. The first insulating film 116 may include one or more insulating films (for example, mutually different insulating materials) such as a silicon oxide film, a silicon nitride film, or an aluminum oxide film.

Second insulating films 117 are provided between the common source regions CSR and are provided on top surfaces and bottom surfaces of the insulating layers 112 and 112a and exposed outer surfaces of the pillars PL. The second insulating films 117 provided on the top surfaces of the highest insulating layer among the insulating layers 112 and 112a may be removed.

In each pillar PL, a film for storing information may be formed when the first insulating film 116 and the second insulating film 117 are connected with each other adjacent to each other. For example, the first insulating film 116 and the second insulating film 117 may include an oxide-nitride-oxide (ONO) or an oxide-nitride-aluminum (ONA). The first insulating film 116 and the second insulating film 117 may form a tunneling insulating film, a charge capturing film, and a blocking insulating film.

Conductive materials CM1 to CM13 are provided on the exposed outer surfaces of the second insulating films 117, between the common source regions CSR and between the insulating layers 112 and 112a. The conductive materials CM1 to CM13 may include conductive metal materials. Drains 118 are provided on the pillars PL. For example, the drains 118 may include semiconductor materials (for example, silicon) having an N conductive type. For example, the drains 118 may make contact with top surfaces of the channel films 115 of the pillars PL.

The bit lines BL2 and BL3 are provided on the drains 118 while extending in the second direction while being spaced apart from each other in the first direction. The bit lines BL2 and BL3 are connected with the drains 118. For example, the drains 118 and the bit lines (for example, BL2 and BL3) may be connected with each other through contact plugs. The bit lines BL1 and BL2 may include metal conductive materials.

As shown in at least FIG. 3, the pillars PL form a plurality of cell strings CS together with the first and second insulating films 116 and 117 and the conductive materials CM1 to CM13. Thus, as shown in FIG. 3 with reference to the first memory cell array 110a, the first memory cell array 110 may include a plurality of cell strings CS. As shown in FIG. 3, each cell string CS may include a plurality of non-volatile memory cells MC1 to MC8, where the plurality of non-volatile memory cells MC1 to MC8 are stacked in a direction perpendicular to the substrate 101, where such a direction may be the third direction. Each of the pillars PL forms one cell string CS together with the first and second insulating films 116 and 117 and conductive materials, which are adjacent to the first and second insulating films 116 and 117, among the conductive materials CM1 to CM13. The first conductive material CM1 may form a ground select transistor GST together with the first and second insulating films 116 and 117, which are adjacent to the first conductive material CM1, and channel films 115. The first conductive material CM1 may extend in the first direction to form the ground select line GSL.

The second conductive material CM2 may form first dummy memory cells DMC1 together with the first and second insulating films 116 and 117, which are adjacent to the first conductive material CM1, and the channel films 115. The second conductive material CM2 may extend in the first direction to form a first dummy word line DWL1.

The third to tenth conductive materials CM3 to CM10 may form first to eighth memory cells MC1 to MC8 together with the first and second insulating films 116 and 117, which are adjacent to the third to tenth conductive materials CM3 to CM10, and the channel films 115. The third to tenth conductive materials CM3 to CM10 may extend in the first direction to form first to eighth word lines WL1 to WL8.

Eleventh conductive materials CM11 may form second dummy memory cells DMC2 together with the first and second insulating films 116 and 117, which are adjacent to the eleventh conductive materials CM11, and the channel films 115. The eleventh conductive material CM11 may extend in the first direction to form a second dummy word line DWL2.

Twelfth conductive materials CM12 may form first to fourth string select transistors SST (hereinafter, lower string select transistors) adjacent to the substrate 101 together with the first and second insulating films 116 and 117, which are adjacent to the twelfth conductive materials CM12, and the channel films 115. The twelfth conductive materials CM12 may extend in the first direction to form first to fourth string select lines SSL1 to SSL4 (hereinafter, lower string select lines) close to the substrate 101.

Thirteenth conductive materials CM13 may form first to fourth string select transistors SST (hereinafter, upper string select transistors) adjacent to the bit lines BL1 to BL4 together with the first and second insulating films 116 and 117, which are adjacent to the thirteenth conductive materials CM13, and the channel films 115. The thirteenth conductive materials CM13 may extend in the first direction to form first to fourth string select lines SSL1 to SSL4 (hereinafter, upper string select lines) close to the bit lines BL1 to BL4.

As the first to thirteenth conductive materials CM1 to CM13 are stacked in the third direction, the ground selection transistor GST, the first dummy memory cell DMC1, the memory cells MC1 to MC8, the second dummy memory cell DMC2, and the string selection transistors SST may be stacked in the third direction on each cell string.

As the channel film 115 in each pillar PL is shared between the first to thirteenth conductive materials CM1 to CM13, the ground select transistor GST, the first dummy memory cell DMC1, the memory cells MC1 to MC8, the second dummy memory cell DMC2, and the string select transistors SST are series-connected in the third direction in each cell string.

As the first to eleventh conductive materials CM1 to CM11 are connected in common, the ground select line GSL, the first dummy word line DWL1, the first to eighth word lines WL1 to WL8, and the second dummy word line DWL2 are shown as being connected in common in the cell strings CS.

Figure 4:
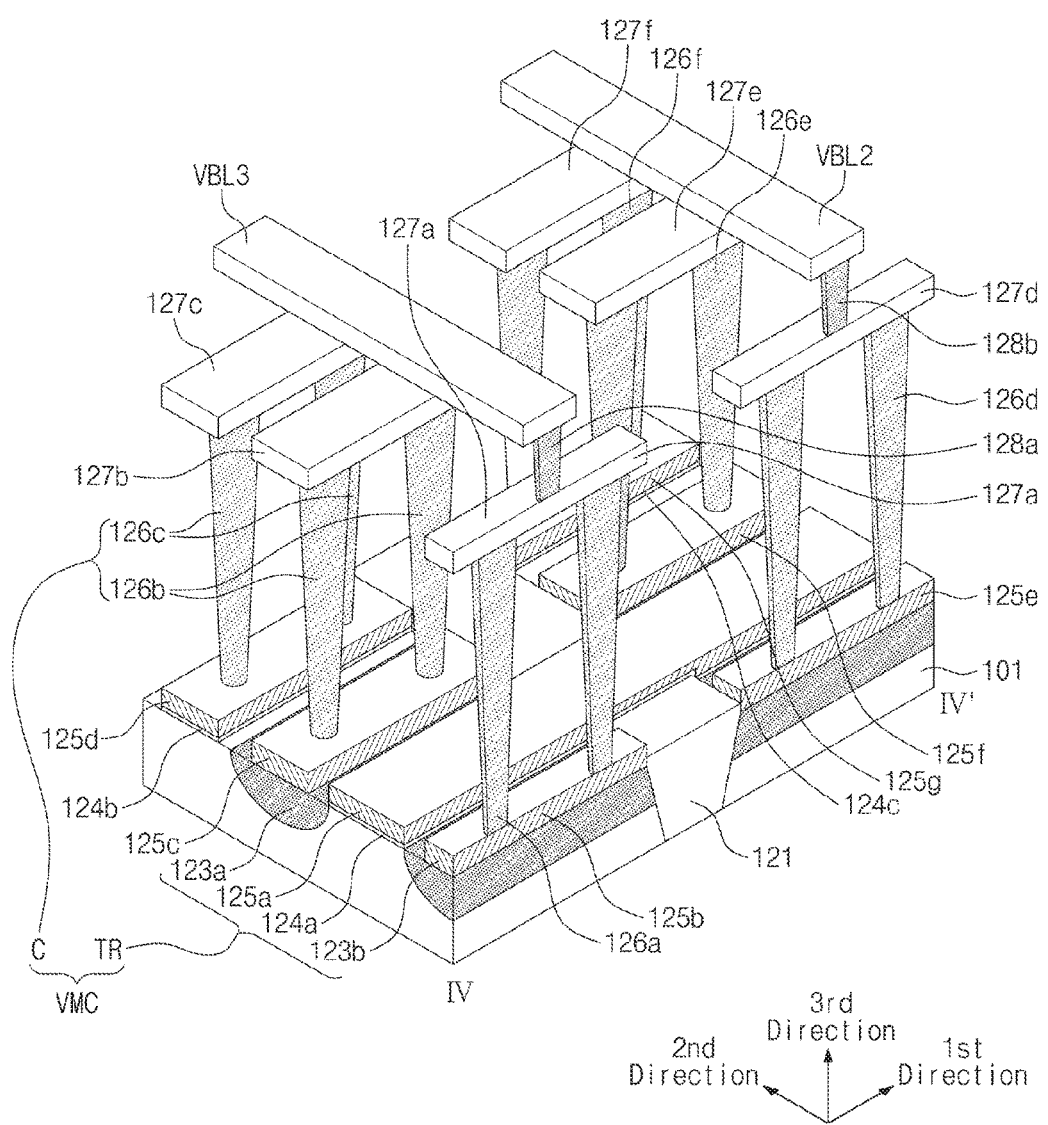
FIG. 4 is a perspective sectional view taken along line IV-IV' of a second memory cell array of FIG. 1.
Figure 5:
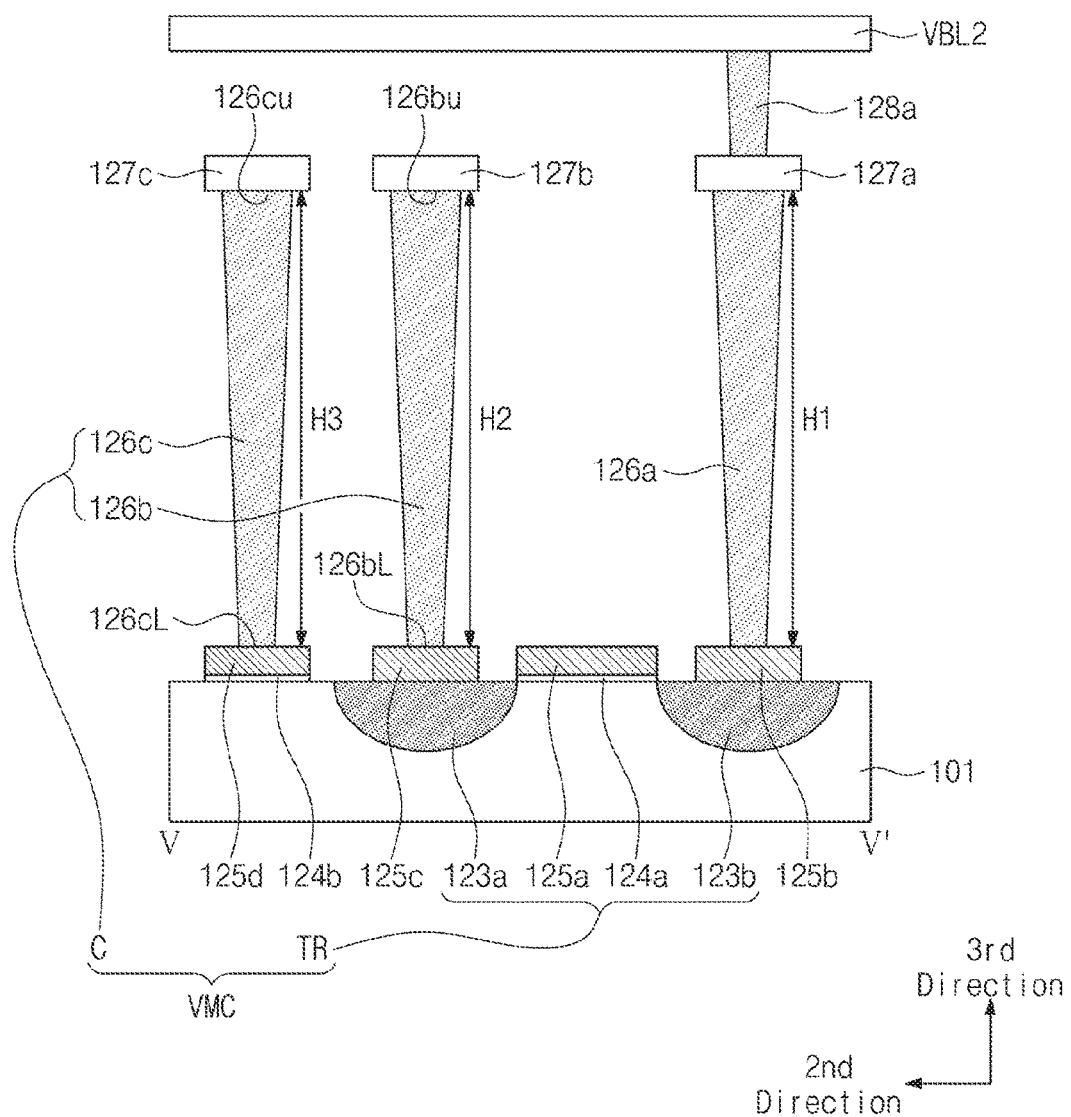
FIG. 5 is a perspective sectional view taken along line V-V' of the first memory cell array of FIG. 1.
Figure 6:
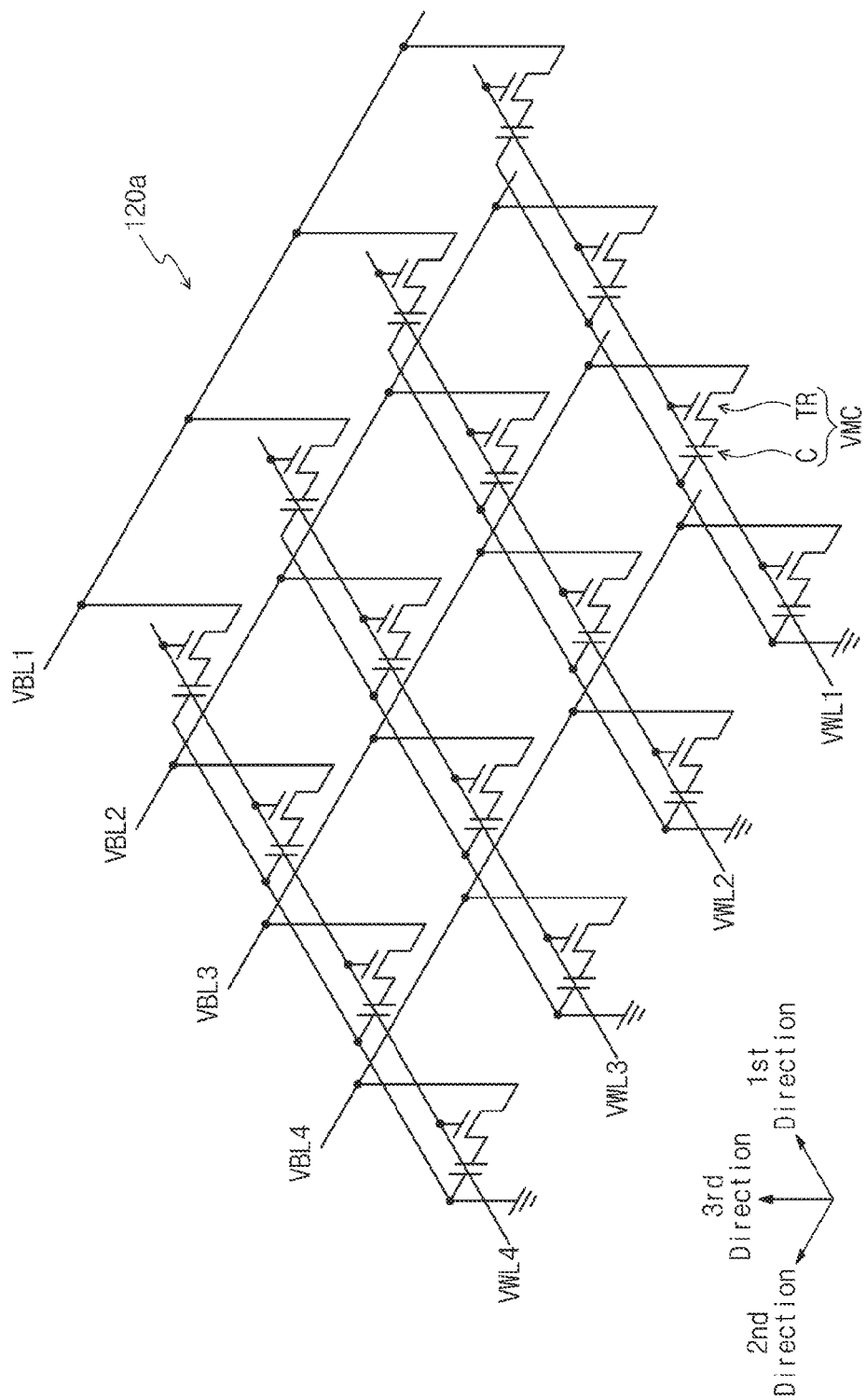
FIG. 6 is a circuit diagram of the second memory cell array of FIG. 4.

FIG. 4 is a perspective sectional view taken along line IV-IV' of the second memory cell array 120a of FIG. 1. FIG. 5 is a perspective sectional view taken along line V-V' of the second memory cell array 120a of FIG. 1. FIG. 6 is a circuit diagram of the second memory cell array 120a of FIG. 4.

Referring to FIGS. 1, and 4 to 6, first junctions 123a and second junctions 123b are provided in the substrate 101 while extending in the first direction and spaced apart from each other in the second direction. The first junctions 123a and the second junctions 123b may have an N conductive type. The first junctions 123a and the second junctions 123b may be separated from each other by an isolating layer 121 extending in the second direction. The isolating layer 121 may include a trench.

A first insulating film 124a may be provided on the substrate 101 between the first junction 123a and the second junction 123b. A first conductive material 125a may be provided on the first insulating film 124a while extending in the first direction. The first conductive material 125a may include a gate pattern. The first conductive material 125a may form ("at least partially comprise") a select transistor TR together with the first and second junctions 123a and 123b which are adjacent to the first conductive material 125a. The first conductive material 125a may extend in the first direction to form a word line (e.g., VWL3). As shown in FIG. 6, at least two volatile memory cells VMC may include respective select transistors TR having respective gates, where the respective gates connected with a common word line (e.g., word line VWL1), such that the respective gates are connected to each other via the common word line (e.g., word line VWL1). As shown in at least FIG. 4, at least two volatile memory cells VMC connected to each other via a common word line (e.g., first conductive material 125a) may include respective conductive patterns (e.g., conductive patterns 127b and 127e) that may be isolated from direct contact with each other.

Second conductive materials 125b and 125e may be formed on the second junctions 123b. The second conductive materials 125b and 125e may include metal silicide to increase the conductivities of the gate pattern or the second junctions 123b. The second conductive materials 125b and 125e may be connected with first conductive patterns 127a and 127d through first contacts 126a and 126d extending in the third direction perpendicular to the substrate 101.

The first conductive patterns 127a and 127d may include metal patterns. The first conductive patterns 127a and 127d may be connected with volatile bit lines (for example, VBL2 and VBL3) through first upper contacts 128a and 128b. The volatile bit lines VBL2 and VBL3 may extend in the second direction. Third conductive materials 125c and 125f may be formed on the first junctions 123a. The third conductive materials 125c and 125f may include metal silicide to increase the conductivities of the gate pattern or the first junctions 123a. The third conductive materials 125c and 125f may be connected with second conductive patterns 127b and 127e through second contacts 126b and 126e extending in the third direction perpendicular to the substrate 101.

Second insulating films 124b and 124c may be provided on positions of the substrate 101, which is spaced apart from the third conductive materials 125c and 125f in the second direction. For example, the second insulating films 124b and 124c may be formed in the form of a trench similarly to the isolating layer 121. Fourth conductive materials 125d and 125g may be provided on the second insulating films 124b and 124c. The fourth conductive materials 125d and 125g may include gate patterns.

Third contacts 126c and 126f may be formed on the fourth conductive materials 125d and 125g. Third conductive patterns 127c and 127f may be formed on the third contacts 126c and 126f. The third contacts 126c and 126f may be connected with the ground node through the third conductive patterns 127c and 127f to receive the ground voltage and thus may be configured to be supplied with a ground voltage.

The second contacts 126b and 126e are immediately adjacent to the third contacts 126c and 126f, respectively, and electrically isolated from each other. Accordingly, the second contacts 126b and 126e may cause capacitive coupling with the third contacts 126c and 126f. Through the capacitive coupling, the second contacts 126b and the third contacts 126c or the second contacts 126e and the third contacts 126f may form ("at least partially comprise") capacitors C of a volatile memory cell VMC. The capacitors C and the select transistor TR may form the volatile memory cell VMC. Thus, as shown in FIG. 6, the second memory cell array 120a may include a plurality of volatile memory cells VMC, where each volatile memory cell VMC of the plurality of volatile memory cells VMC includes a select transistor TR and a capacitor C. And, as further shown in FIGS. 4-6, the capacitor C of a volatile memory cell VMC may include at least one first contact (e.g., second contact 126b) electrically connected with the select transistor TR of the volatile memory cell VMC, the at least one first contact having a second height H2 corresponding to a first height H1 of each cell string CS of the plurality of cell strings CS. In addition, the capacitor CS of the volatile memory cell VMC may include at least one second contact (e.g., third contact 126c) configured to be supplied with a ground voltage, the at least one second contact having a third height H3 corresponding to the first height H1 of each cell string CS of the plurality of cell strings CS. As shown in at least FIG. 5 with reference to second contact 126b and third contact 126c, the at least one second contact (e.g., third contact 126c) may be adjacent to the at least one first contact (e.g., second contact 126b) of the volatile memory cell VMC, and the at least one second contact (e.g., third contact 126c) may be electrically disconnected with the at least one first contact (e.g., second contact 126b) of the volatile memory cell VMC.

As shown in FIGS. 4-5, a capacitor C may include a plurality of first contacts (e.g., multiple second contacts 126b) and may further include a conductive pattern (e.g., second conductive pattern 127b) on respective top surfaces (e.g., top surfaces 126bU) of the plurality of first contacts (e.g., second contacts 126b), such that the conductive pattern (e.g., first conductive pattern 127a) is configured to connect the plurality of first contacts (e.g., second contacts 126b) with each other.

In some example embodiments, a conductive material (e.g., third conductive material 125c) may be referred to as a "conductive pattern." Thus, a capacitor C may include a conductive pattern (e.g., third conductive material 125c) between respective bottom surfaces (e.g., bottom surfaces 126bL) of a plurality of first contacts (e.g., second contacts 126b) and the substrate 101, such that the conductive pattern connects the plurality of first contacts with each other.

As shown in FIGS. 4-5, the capacitor C may include a plurality of second contacts (e.g., third contacts 126c). The capacitor C may further include a conductive pattern (e.g., fourth conductive material 125d) between respective bottom surfaces 126cL of the plurality of second contacts (e.g., third contacts 126c) and the substrate 101. The conductive pattern (e.g., fourth conductive material 125d) may be configured to connect the plurality of second contacts (e.g., third contacts 126c) with each other. The capacitor C further include an insulating material (e.g., second insulating film 124b) between the respective bottom surfaces (e.g., 126cL) of the plurality of second contacts (e.g., third contacts 126c) and the substrate 101, where the insulating pattern (e.g., second insulating film 124b) is configured to insulate the conductive pattern (e.g., fourth conductive material 125d) from the substrate 101.

As shown in FIGS. 4-5, the capacitor C may further include a conductive pattern (e.g., third conductive pattern 127c) on respective top surfaces (e.g., top surfaces 126cU) of the plurality of second contacts (e.g., third contacts 126c), such that the conductive pattern (e.g., third conductive pattern 127c) is configured to connect the plurality of second contacts (e.g., third contacts 126c) with each other. As shown in FIGS. 4-6, at least two volatile memory cells VMC may include respective select transistors TR having respective gates, where the respective gates are connected with a common word line (e.g., VWL1 at least partially comprised by first conductive material 125a), such that the respective gates are connected to each other via the common word line. The at least two volatile memory cells VMC may include respective conductive patterns connected with each other (e.g., first conductive material 125a).

As shown in at least FIG. 4, the at least one first contact (e.g., second contact 126b) may extend in a direction perpendicular to the substrate 101 (e.g., the third direction) and may be connected with a first junction (e.g., first junction 123a) of the select transistor TR of the volatile memory cell VMC in which the at least one first contact is included.

As further shown in at least FIGS. 4-5, each volatile memory cell VMC may further include at least one third contact (e.g., first contact 126a) that extends in a direction perpendicular to the substrate 101 (e.g., the third direction), where the at least one third contact (e.g., first contact 126a) is connected with a second junction (e.g., second junction 123b) of the select transistor TR of the volatile memory cell VMC.

Still referring to FIG. 4, a plurality of volatile memory cells VMC may be symmetrical to each other.

As illustrated in FIG. 5, volatile memory cells VMC are arranged in the first direction and the second direction to be connected with the first to fourth volatile word lines VWL1 to VWL4 or the first to fourth volatile bit lines VBL1 to VBL4. In other words, the second memory cell array 120a may be formed.

As the height of a first memory cell array 110a is increased, the height of a layer, at which the bit lines BL1 to BL4 and the volatile bit lines VBL1 to VBL4 are formed, is increased. As the height of the volatile bit lines VBL1 to VBL4 is increased, the heights of the second contacts 126b and 126e and the third contacts 126c and 126f are increased. Accordingly, the capacitive coupling between the second contacts 126b and 126e and the third contacts 126c and 126f is strengthened.

According to some example embodiments of the inventive concepts, the volatile memory cells VMC employing the contacts for a capacitor is provided based on that the heights of the contacts are increased as the height of the first memory cell array 110a having the stack structure is increased. Accordingly, the semiconductor memory having the heterogeneous memory cells using the height difference is provided.

FIG. 4 illustrates that the conductive material 125b, 125c, 125d, 125e, 125f or 125g is connected with the relevant conductive pattern 127a, 127b, 127c, 127d, 127e or 127f through two contacts 126a, 126b, 126c, 126d, 126e, or 126f. However, the conductive material 125b, 125c, 125d, 125e, 125f or 125g may be connected with the relevant conductive pattern 127a, 127b, 127c, 127d, 127e or 127f through at least one conductive pattern.

For example, a conductive material may be filled between the second contacts 126b and 126e forming a first pole of the capacitor C or between the third contacts 126c and 126f forming a second pole of the capacitor C. In other words, the at least one pair of contacts may be substituted with the form of a wall filled with the conductive material.

In some example embodiments, a method of manufacturing a semiconductor memory, including the semiconductor memory and elements thereof as shown in FIGS. 1-6, may include providing a first memory cell array 110a on a substrate 101, the providing the first memory cell array 110a including providing a plurality of cell strings CS on the substrate 101 in a direction perpendicular to the substrate 101 (e.g., the third direction), each cell string CS including a separate stack of first memory cells MC1 to MC8 of the first memory cell array 110a. The method may further include providing a second memory cell array 120a on the substrate 101, the providing the second memory cell array 120a including 1) providing at least one first contact (e.g., second contact 126b), the at least one first contact having a second height H2 corresponding to a first height H1 of each cell string CS of the plurality of cell strings, 2) providing at least one second contact (e.g., third contact 126c), the at least one second contact having a third height H3 corresponding to the first height H1 of each cell string CS of the plurality of cell strings, 3) electrically connecting the at least one first contact with a select transistor TR, and 4) electrically connecting the at least one second contact with a ground node (e.g., via third conductive pattern 127c).

Figure 7:
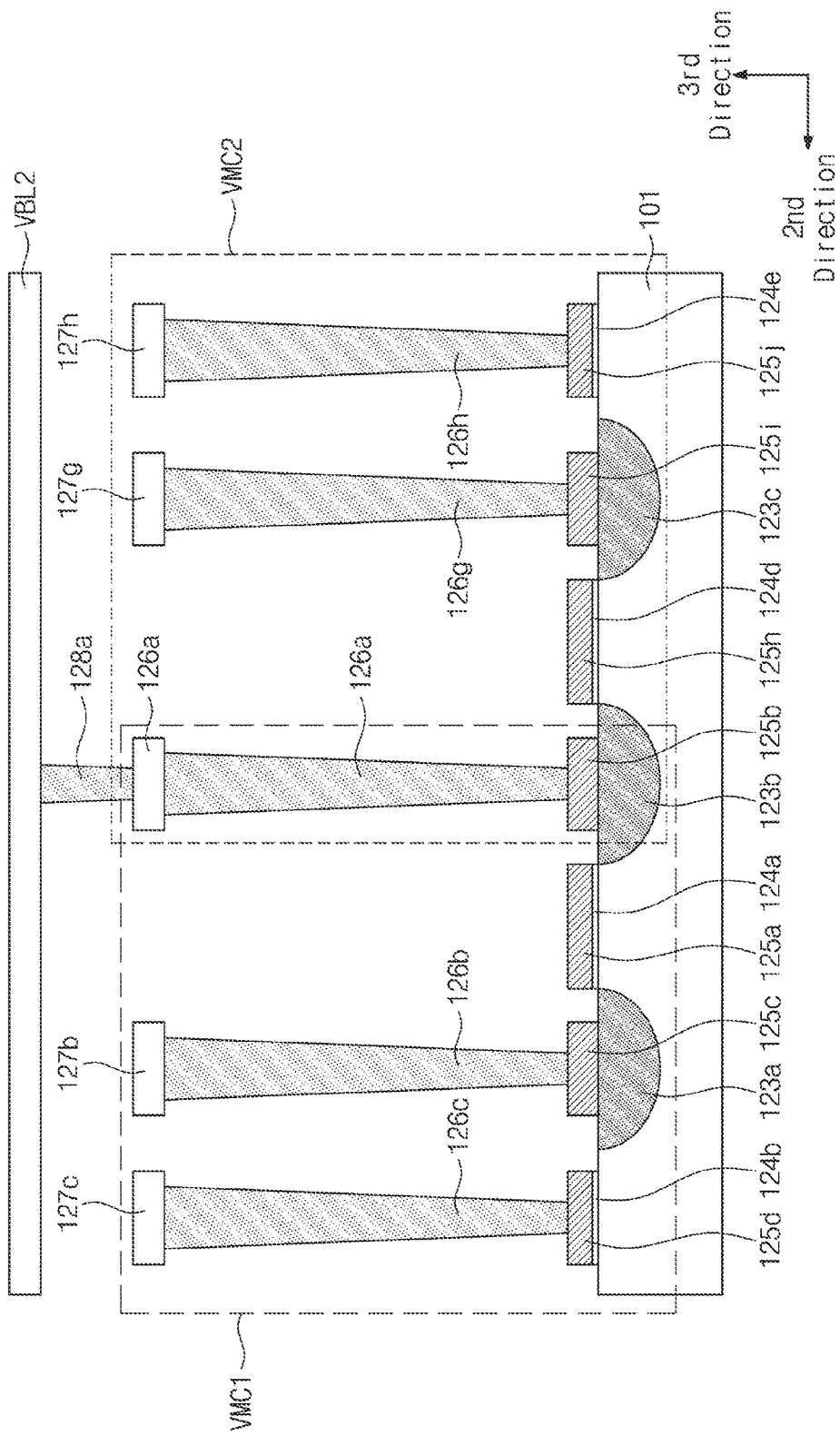
FIG. 7 illustrates an application example of the sectional view of FIG. 5.

FIG. 7 illustrates an application example of the sectional view of FIG. 5. Referring to FIGS. 1, 6, and 7, a third junction 123c is provided at the side of the second junction 123b in a direction opposite to the second direction when comparing with FIG. 5. The third junction 123c may have an N conductive type. A third insulating film 124d is formed on the substrate 101 between the second and third junctions 123b and 123c. A fifth insulating material 125h is formed on the third insulating film 124d. The fifth insulating material 125h may form a select transistor TR together with the second and third junctions 123b and 123c.

A sixth conductive material 125i, a fourth contact 126g, and a fourth conductive pattern 127g are formed on the third junction 123c. A fourth insulating film 124e is formed on the substrate 101 at the side of the sixth conductive material 125i in a direction opposite to the second direction. The fourth insulating film 124e may be provided in the form of a trench.

A seventh conductive material 125j, a fifth contact 126h, and a fifth conductive pattern 127h are formed on the fourth insulating film 124e. The fourth and fifth contacts 126g and 126h may form a capacitor C. In other words, two volatile memory cells VMC may be disposed symmetrically to each other ("may be symmetrical to each other") about the second junction 123b connected with a volatile bit line VBL2. Restated, and as shown in at least FIG. 7, two volatile memory cells VMC1 and VMC2 may be symmetrical to each other and may share a common second junction (e.g., second junction 123b) and may further share a common third contact (e.g., first contact 126a).

Figure 8:
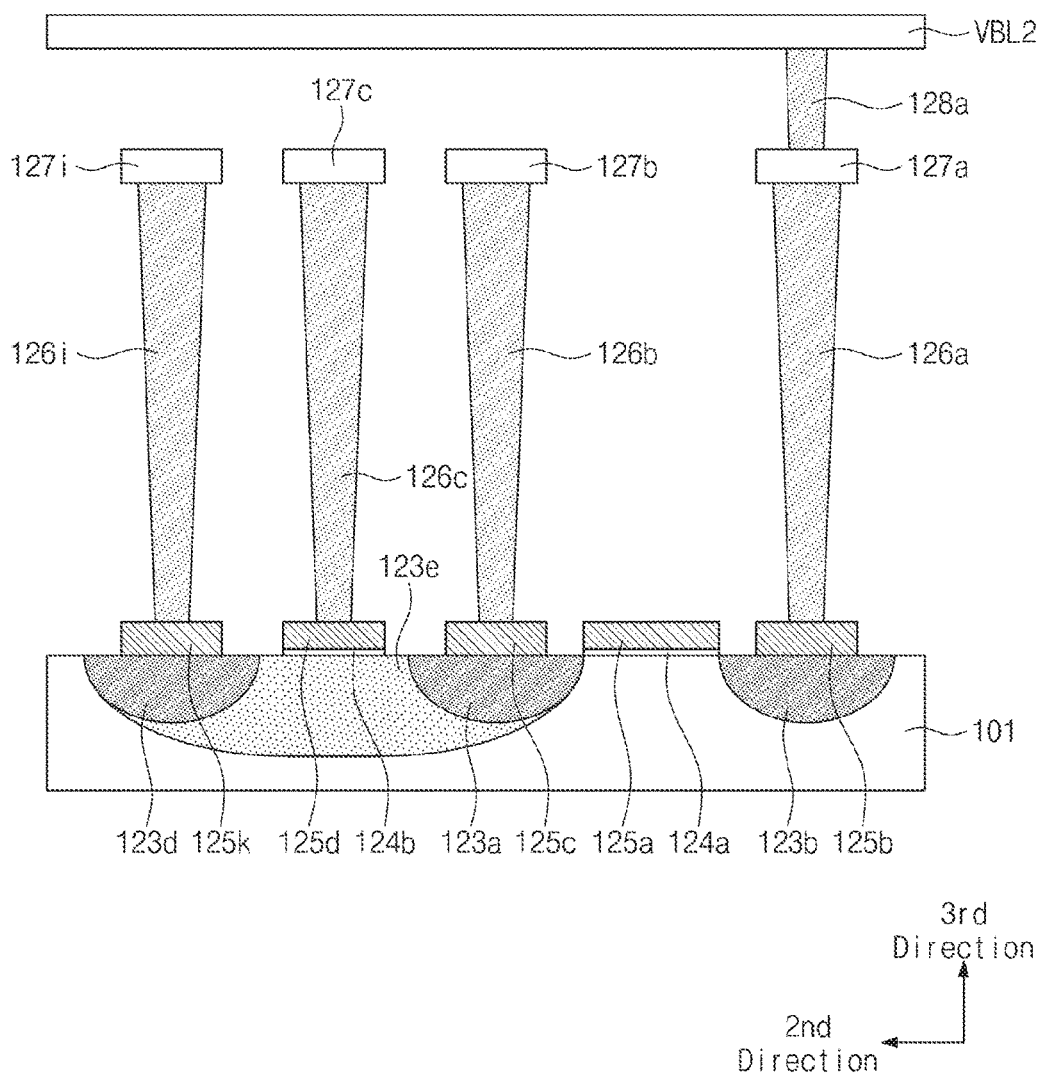
FIG. 8 illustrates another application example of the sectional view of FIG. 5.

FIG. 8 illustrates another application example of the sectional view of FIG. 5. Referring to FIGS. 1, 6, and 8, a fourth junction 123d is formed at the side of the fourth conductive material 125d in the second direction when comparing with FIG. 5. The fourth junction 123d may have an N conductive type. An eighth conductive material 125k, a sixth contact 126i, and a sixth conductive pattern 127i are formed on the fourth junction 123d.

A fifth junction 123e including the first and fourth junctions 123a and 123d may be formed in the substrate 101. The fifth junction 123e may have the same conductive type as those of the first and fifth junctions 123a and 123d. The fifth junction 123e may have a doping concentration lighter or heavier than those of the first and fourth junctions 123a and 123d. The fifth junction 123e may be referred to herein as a "deep junction" that includes a first junction (e.g., first junction 123a) of the select transistor TR and a second junction (e.g., fourth junction 123d). A volatile memory cell VMC may thus include at least one third contact (e.g., contact 126i) extending in a direction perpendicular to the substrate 101, the at least one third contact connected with the second junction (e.g., fourth junction 123d), wherein the at least one second contact (e.g., third contact 126c) of the capacitor C of the volatile memory cell VMC may be between the at least one first contact of the capacitor C (e.g., second contact 126b) and the at least one third contact (e.g., contact 126*i*). The at least one second contact (e.g., third contact 126*c*) may extend in the direction perpendicular to the substrate 101 and may be connected with an insulating material (e.g., second insulating film 124*b*) on the deep junction (e.g., fifth junction 123*e*).

The fifth junction 123*e* electrically connects the second contact 126*b* with the sixth contact 126*i*. Accordingly, the second contact 126*b* and the sixth contact 126*i* may form a first pole of a capacitor C and the third contact 126*c* may form a second pole of the capacitor C. Since the second contact 126*b* and the sixth contact 126*i* surround the third contact 126*c*, the capacitance of the capacitor C may be increased. For example, as described above with reference to FIG. 7, the memory cells having the structure illustrated in FIG. 8 may be disposed symmetrically to each other about the first contact 126*a*.

Figure 9:
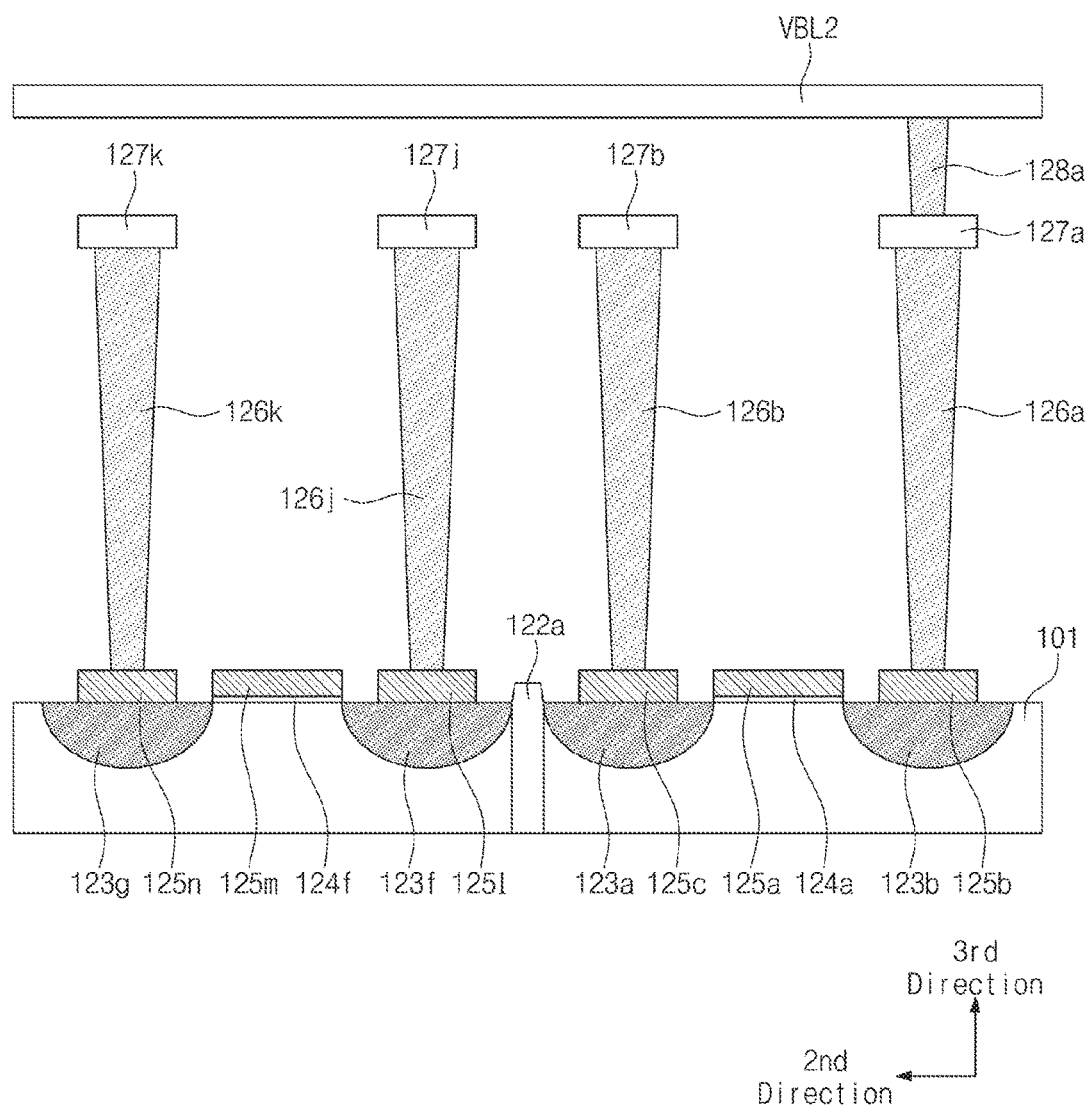
FIG. 9 illustrates still another application example of the sectional view of FIG. 5.
Figure 10:
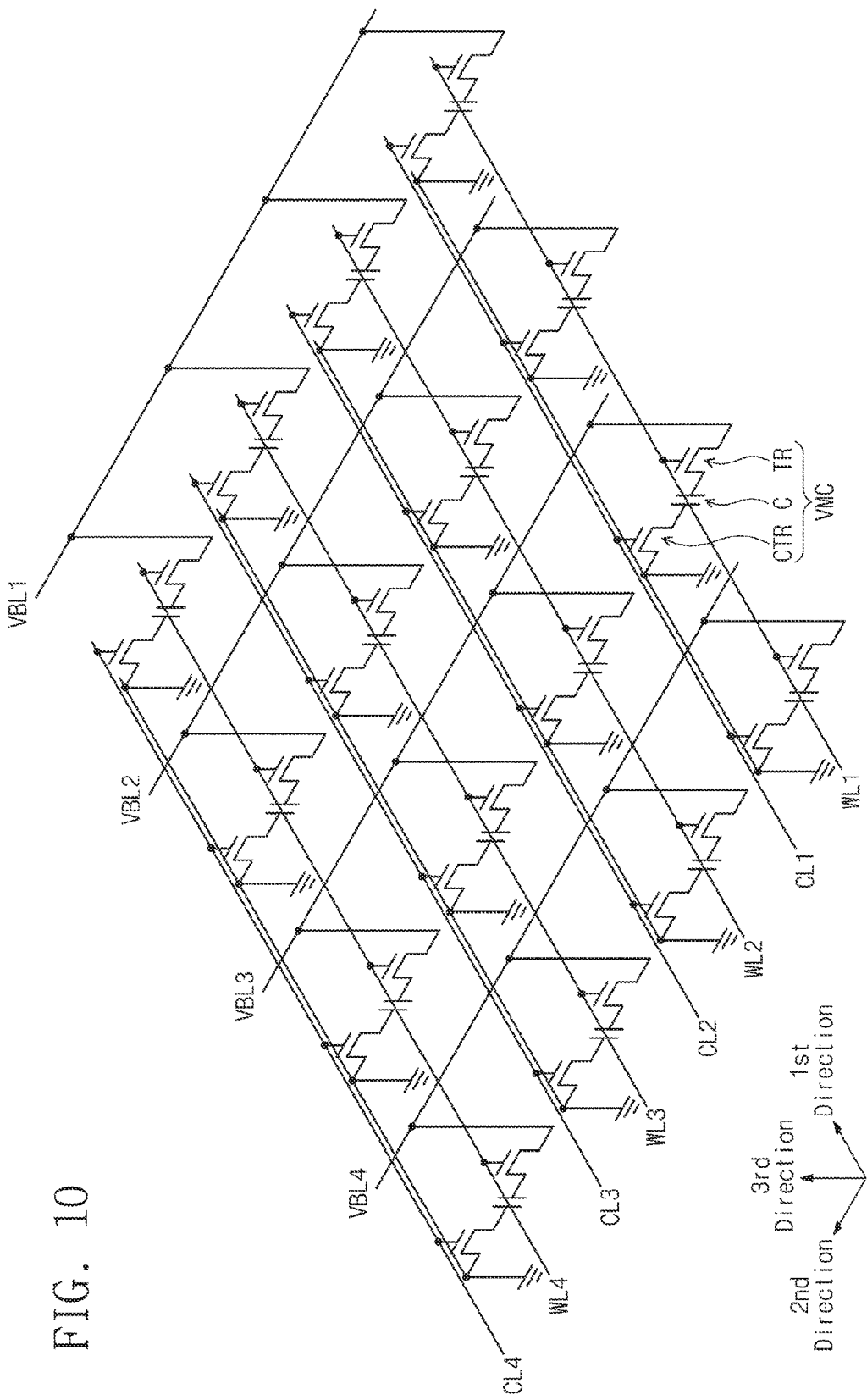
FIG. 10 is a circuit diagram based on the sectional view of FIG. 9.

FIG. 9 illustrates still another application example of the sectional view of FIG. 5. FIG. 10 is a circuit diagram based on the sectional view of FIG. 9. Referring to FIGS. 1, 9, and 10, a sixth junction 123*f* may be formed at the side of the first junction 123*a* in the second direction when comparing with FIG. 5. The sixth junction 123*f* may have an N conductive type. The sixth junction 123*f* and the first junction 123*a* may be separated from each other by the first insulating material 122*a*. The first insulating material 122*a* may be formed in the form of a trench to electrically disconnect the first and sixth junctions 123*a* and 123*f* from each other.

A ninth conductive material 125*l* is formed on the sixth junction 123*f*. The ninth conductive material 125*l* may include a gate pattern or metal silicide. A seventh contact 126*j* is formed on the ninth conductive material 125*l*. A seventh conductive pattern 127*j* may be formed on the seventh contact 126*j*.

A seventh junction 123*g* is formed at the side of the sixth junction 123*f* in the second direction. A fifth insulating film 124*f* is formed on the substrate 101 between the seventh junction 123*g* and the sixth junction 123*f*. A tenth conductive material 125*m* is formed on the fifth insulating film 124*f*. The tenth conductive material 125*m* may form a control transistor CTR together with the sixth and seventh junctions 123*f* and 123*g* which are adjacent to the tenth conductive material 125*m*. The tenth conductive material 125*m* may extend in the first direction to form a control line (for example, one of CL1 to CL4). Thus, a volatile memory cell VMC may include a control transistor (e.g., conductive material 125*m*) that is connected between the capacitor C of the volatile memory cell VMC (e.g., a capacitor including contacts 126*b* and 126*j*) and a node configured to be supplied with a ground voltage (e.g., eighth conductive pattern 127*k* connected to a ground node to be configured to receive a ground voltage). In addition, the at least one second contact of the volatile memory cell VMC (e.g., seventh contact 126*j*) may extend in a direction perpendicular to the substrate 101 and may be connected with one junction (e.g., sixth junction 123*f*) of a plurality of junctions of the control transistor CTR of the volatile memory cell VMC.

The seventh junction 123*g* may have an N conductive type. An eleventh conductive material 125*n* is formed on the seventh junction 123*g*. The eleventh conductive material 125*n* may include a gate pattern or metal silicide. An eighth contact 126*k* is formed on the eleventh conductive material 125*n*. An eighth conductive pattern 127*k* is formed on the eighth contact 126*k*. The eighth conductive pattern 127*k* is connected with the ground node to receive the ground voltage.

The second contact 126*b* and the seventh contact 126*j* may form a capacitor C. The capacitor C, a select transistor TR, and a control transistor CTR may form a volatile memory cell VMC. As the control transistor CTR is provided, the VMC may be more dedicatedly controlled. For example, as described with reference to FIG. 7, memory cells having the structure illustrated in FIG. 9 may be disposed symmetrically to each other about the first contact 126*a*.

Figure 11:
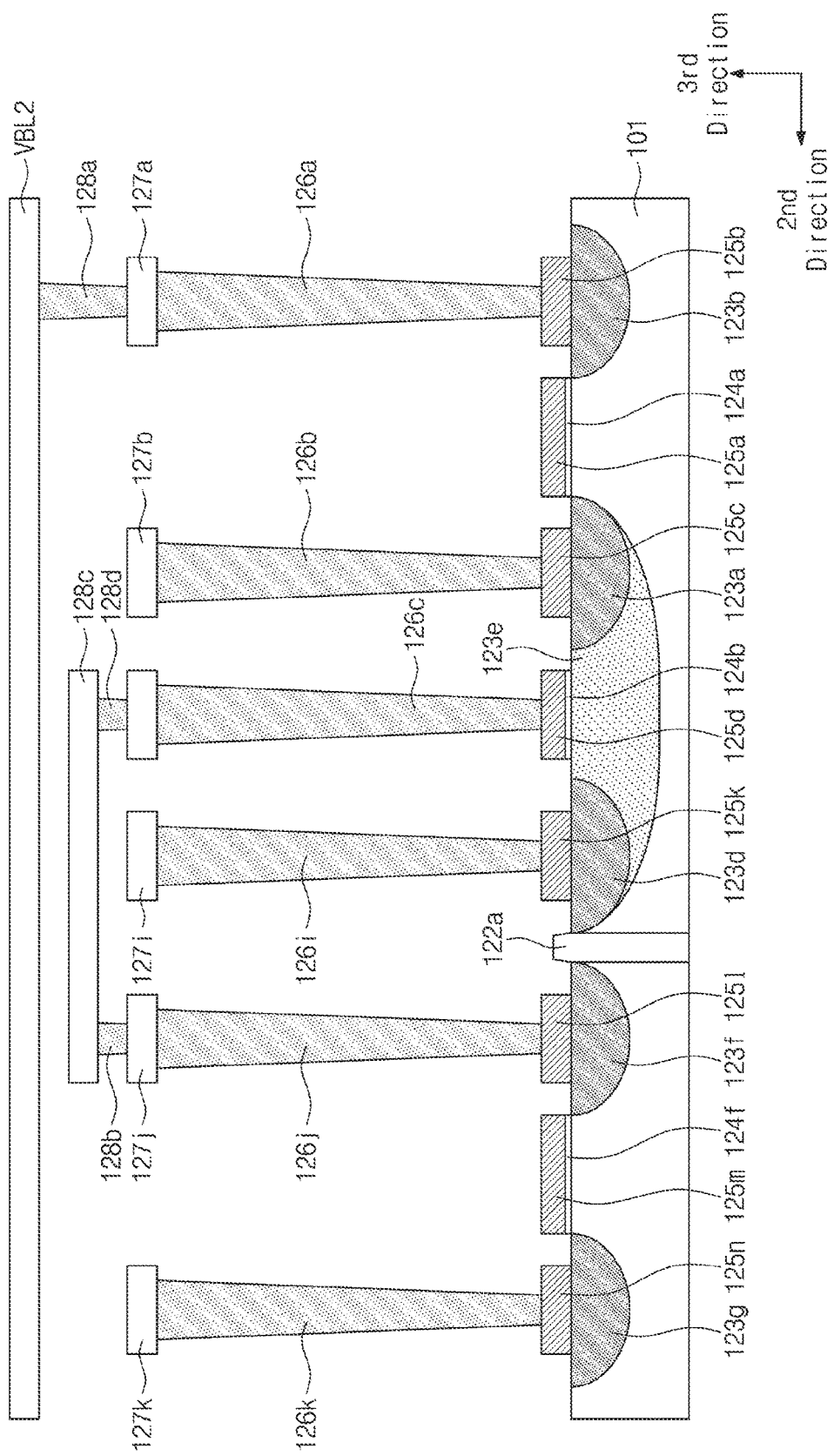
FIG. 11 is a sectional view illustrating the combination of the application example of FIG. 8 and the application example of FIG. 9.

FIG. 11 is a sectional view illustrating the combination of the example of FIG. 8 and the example of FIG. 9. Referring to FIGS. 1, 8, 9, 10, and 11, the sixth junction 123*f* is formed at the side of the fourth junction 123*d* in the second direction when comparing with FIG. 8. The sixth junction 123*f* may have the N conductive type. The sixth junction 123*f* and the fourth junction 123*d* may be separated from each other by the first insulating material 122*a*. The first insulating material 122*a* may be formed in the form of a trench to electrically disconnect the fourth and sixth junctions 123*d* and 123*f* from each other.

The ninth conductive material 125*l* is formed on the sixth junction 123*f*. The ninth conductive material 125*l* may include a gate pattern or metal silicide. The seventh contact 126*j* is formed on the ninth conductive material 125*l*. A seventh conductive pattern 127*j* may be formed on the seventh contact 126*j*.

A second upper contact 128*c* is formed on the seventh conductive pattern 127*j*. A first upper conductive pattern 129*a* is formed on the second upper contact 128*c*. The first upper conductive pattern 129*a* may extend in the direction opposite to the second direction through an upper portion of the sixth conductive pattern 127*i*. For example, the first upper conductive pattern 129*a* may be extended to the upper portion of the third conductive pattern 127*c*. The first upper conductive pattern 129*a* may be connected with the third conductive pattern 127*c* through the third upper contact 128*d*.

The seventh junction 123*g* is formed at the side of the sixth junction 123*f* in the second direction. The fifth insulating film 124*f* is formed on the substrate 101 between the seventh junction 123*g* and the sixth junction 123*f*. The tenth conductive material 125*m* is formed on the fifth insulating film 124*f*. The tenth conductive material 125*m* may form a control transistor CTR together with the sixth and seventh junctions 123*f* and 123*g* which are adjacent to the tenth conductive material 125*m*. The tenth conductive material 125*m* extends in the first direction to form a control line (for example, one of CL1 to CL4).

The seventh junction 123*g* may have an N conductive type. The eleventh conductive material 125*n* is formed on the seventh junction 123*g*. The eleventh conductive material 125*n* may include a gate pattern or metal silicide. The eighth contact 126*k* is formed on the eleventh conductive material 125*n*. An eighth conductive pattern 127*k* is formed on the eighth contact 126*k*. The eighth conductive pattern 127*k* may be connected with the ground node to receive the ground voltage.

The third contact 126*c* may form a first pole of a capacitor C. The second contact 126*b* and the sixth contact 126*i* may form second poles of the capacitor C. The control transistor CTR may supply the ground voltage to the third contact 126*c* through the seventh contact 126*j*, the seventh conductive pattern 127*j*, the second upper contact 128*c*, the first upper conductive pattern 129*a*, the third upper contact 128*d*, and the third conductive pattern 127*c*. For example, as described with reference to FIG. 7, the memory cells having the structure illustrated in FIG. 9 may be disposed symmetrically to each other about the first contact 126a.

Figure 12:
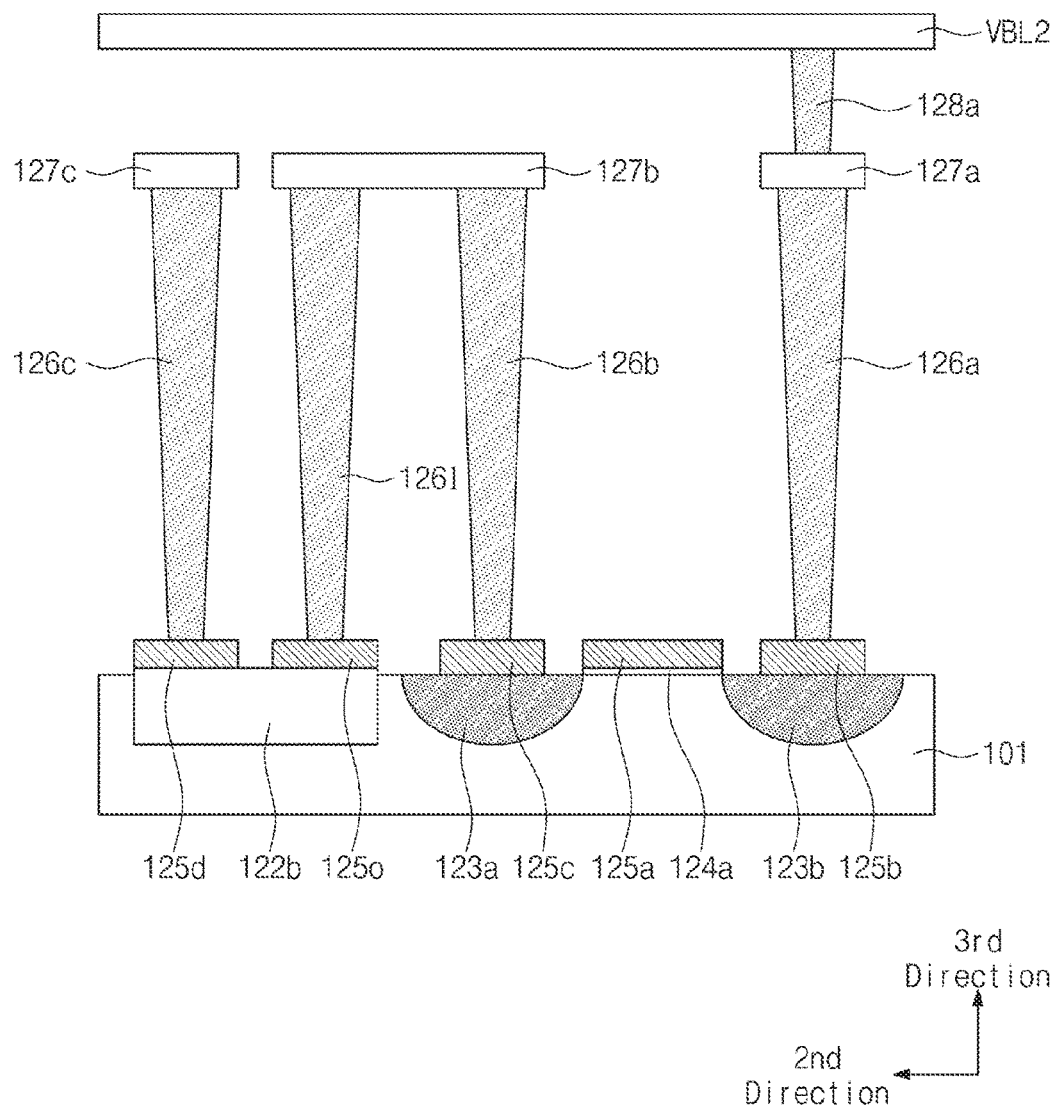
FIG. 12 illustrates another application example of the sectional view of FIG. 5.

FIG. 12 illustrates another application example of the sectional view of FIG. 5. Referring to FIGS. 1, 6, and 12, a second insulating material 122b may be provided at the side of the first junction 123a in the second direction when comparing with FIG. 5. The second insulating material 122b may be provided in the form of a trench. Restated, where a volatile memory cell VMC includes a capacitor C including first and second contacts (e.g., contacts 126b and 126c, respectively), said contacts may be connected with an insulating material (e.g., insulating material 122b) on the substrate 101.

A twelfth conductive material 125o is formed on the second insulating material 122b more adjacent to the first junction 123a. The fourth conductive material 125d is formed on the second insulating material 122b further apart from the first junction 123a. The twelfth conductive material 125o and the fourth conductive material 125d may include gate patterns.

The second conductive pattern 127b may extend in the second direction. For example, the second conductive pattern 127b may extend above the second insulating material 122b. The second conductive pattern 127b may be provided above the second insulating material 122b to be connected with the second insulating material 122b (for example, the twelfth conductive material 125o on the second insulating material 122b) through a ninth contact 126l.

The third contact 126c may be formed on the fourth conductive material 125d. The third conductive pattern 127c may be formed on the third contact 126c. The third conductive pattern 127c may be connected with the ground node to receive the ground voltage. The third contact 126c and the ninth contact 126l may form the capacitor C. For example, as described with reference to FIG. 7, the memory cells having the structure illustrated in FIG. 12 may be disposed symmetrically to each other about the first contact 126a.

Figure 13:
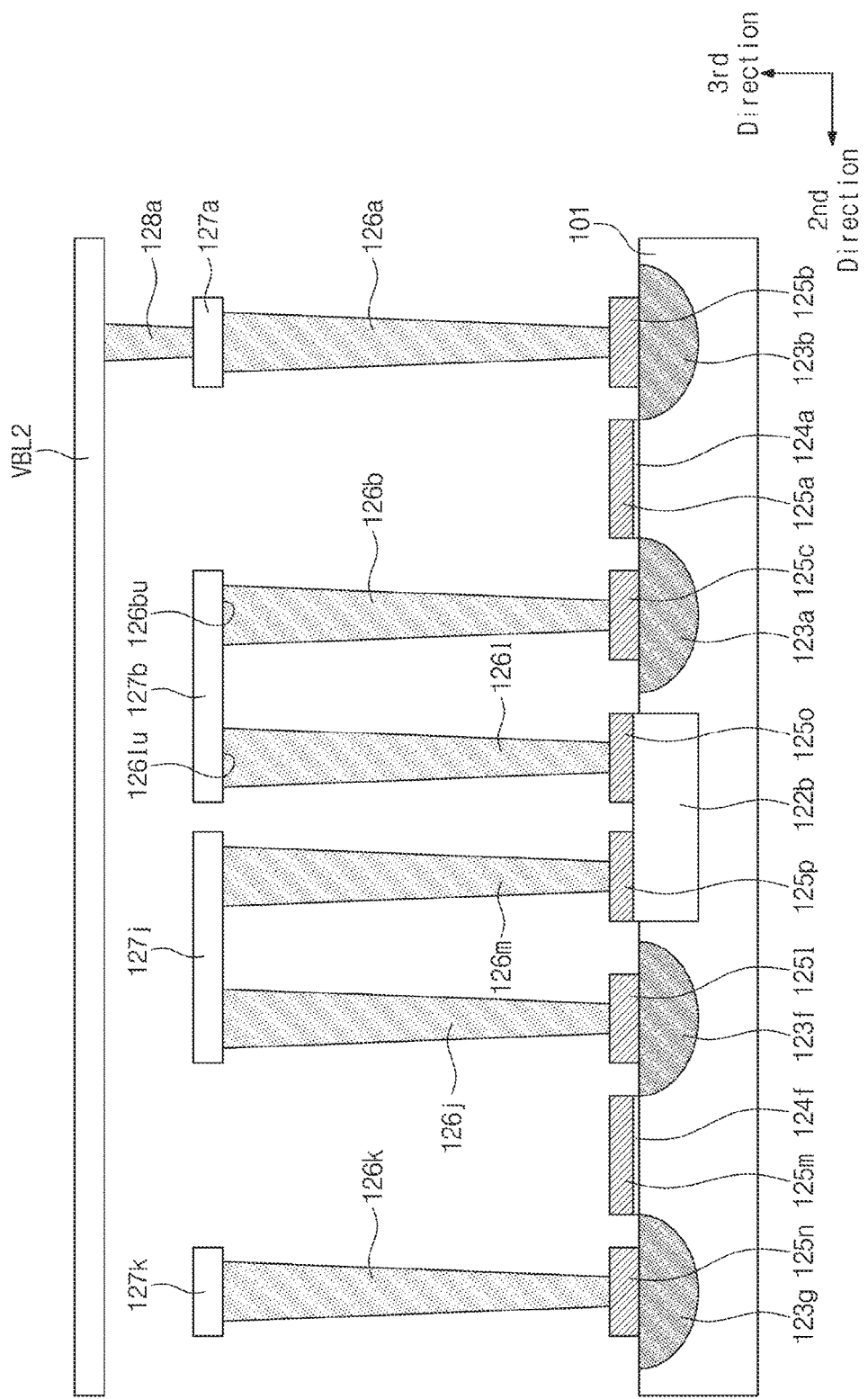
FIG. 13 illustrates the combination of the example embodiments of FIG. 9 and the example embodiments of FIG. 12.

FIG. 13 illustrates the combination of the example embodiments of FIG. 9 and the example embodiments of FIG. 12. Referring to FIGS. 1, 10, and 13, the second insulating material 122b may be provided at the side of the first junction 123a in the second direction when comparing with FIG. 5. The second insulating material 122b may be provided in the form of a trench.

The twelfth conductive material 125o is formed on the second insulating material 122b more adjacent to the first junction 123a. A thirteenth conductive material 125p is formed on the second insulating material 122b further apart from the first junction 123a. The twelfth conductive material 125o and the thirteenth conductive material 125p may include gate patterns.

The second conductive pattern 127b may extend in the second direction. For example, the second conductive pattern 127b may extend above the second insulating material 122b. The second conductive pattern 127b provided above the second insulating material 122b may be connected with the second insulating material 122b (for example, the twelfth conductive material 125o on the second insulating material 122b) through the ninth contact 126l.

The sixth junction 123f may be formed at the side of the second insulating material 122b in the second direction. The sixth junction 123f may have an N conductive type. The ninth conductive material 125l is formed on the sixth junction 123f. The ninth conductive material 125l may include a gate pattern or metal silicide. The seventh contact 126j is formed on the ninth conductive material 125l. The seventh conductive pattern 127j may be formed on the seventh contact 126j.

The seventh conductive pattern 127j may extend in the direction opposite to the second direction. For example, the seventh conductive pattern 127j may extend above the second insulating material 122b. The seventh conductive pattern 127 provided above the second insulating material 122b may be connected with the second insulating material 122b (for example, the thirteenth conductive material 125p on the second insulating material 122b) through a tenth contact 126m.

The seventh junction 123g is formed at the side of the sixth junction 123f in the second direction. The fifth insulating film 124f is formed on the substrate 101 between the seventh junction 123g and the sixth junction 123f. The tenth conductive material 125m is formed on the fifth insulating film 124f. The tenth conductive material 125m may form a control transistor CTR together with the sixth and seventh junctions 123f and 123g adjacent to the tenth conductive material 125m. The tenth conductive material 125m may extend in the first direction to form a control line (for example, one of CL1 to CL4).

The seventh junction 123g may have an N conductive type. The eleventh conductive material 125n is formed on the seventh junction 123g. The eleventh conductive material 125n may include a gate pattern or metal silicide. The eighth contact 126k is formed on the eleventh conductive material 125n. The eighth conductive pattern 127k is formed on the eighth contact 126k. The eighth conductive pattern 127k may be connected with the ground node to receive the ground voltage.

The ninth contact 126l and the tenth contact 126m may form a capacitor C. The capacitor C, the select transistor TR, and the control transistor CTR may form a volatile memory cell VMC. As the control transistor CTR is provided, the volatile memory cell VMC may be more delicately controlled. For example, as described with reference to FIG. 7, the memory cells having the structure illustrated in FIG. 13 may be disposed symmetrically to each other about the first contact 126a.

Figure 14:
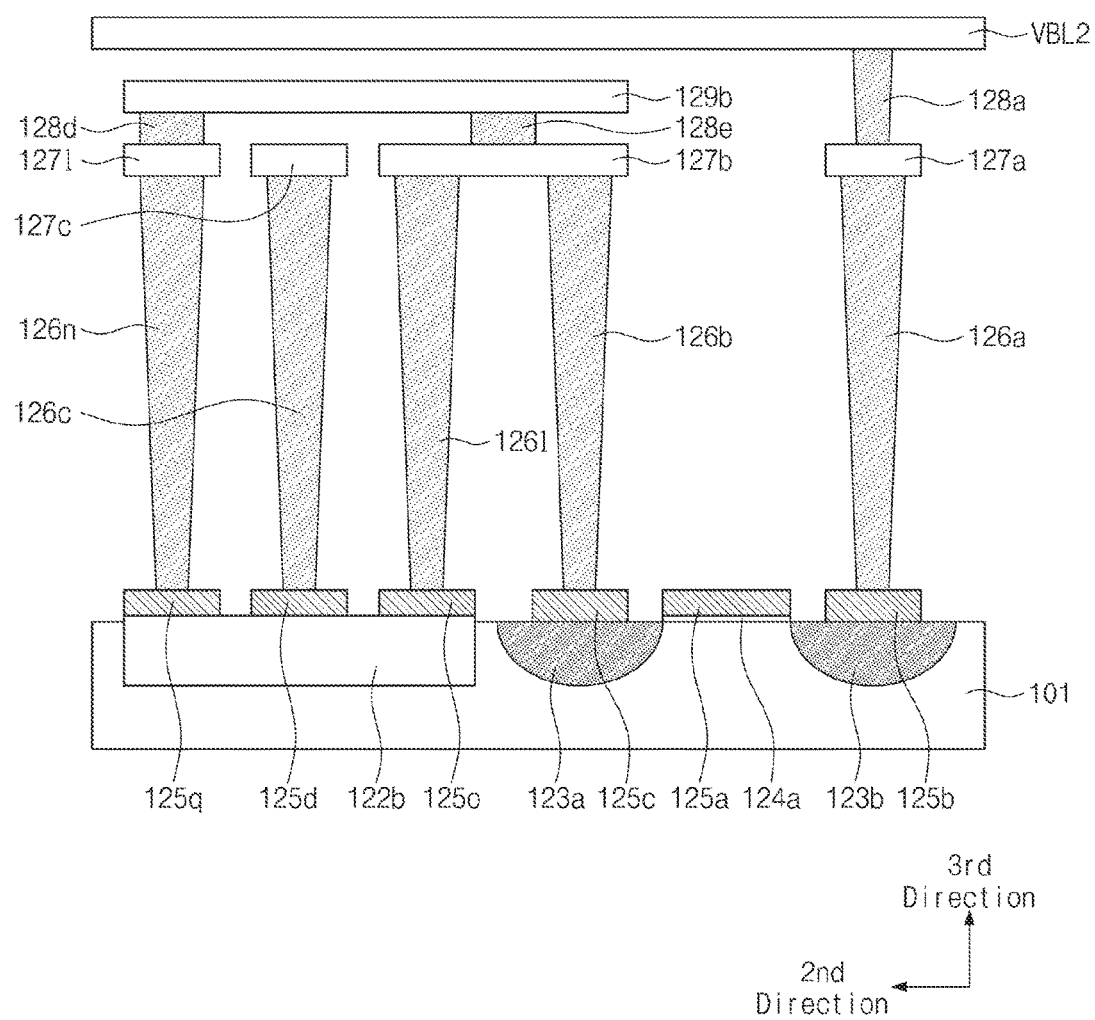
FIG. 14 is a sectional view illustrating the application example of FIG. 12.

FIG. 14 is a sectional view illustrating the application example of FIG. 12. Referring to FIGS. 1, 6, and 14, a fourteenth conductive material 125q is provided on the second insulating material 122b at the side of the fourth conductive material 125d in the second direction when comparing with FIG. 12. An eleventh contact 126n is provided on the fourteenth conductive material 125q. A ninth conductive pattern 127l is formed on the eleventh contact 126n.

A fourth upper contact 128e is formed on the ninth conductive pattern 127l. A second upper conductive pattern 129b is formed on the fourth upper contact 128e. The second upper conductive pattern 129b may extend in a direction opposite to the second direction. For example, the second upper conductive pattern 129b may extend above the second conductive pattern 127b.

The second upper conductive pattern 129b provided above the second conductive pattern 127b may be connected with the second conductive pattern 127b through the fifth upper contact 128f. For example, as described with reference to FIG. 7, the memory cells having the structure illustrated in FIG. 14 may be disposed symmetrically to each other about the first contact 126a.

Referring to FIG. 14, at least one first contact and at least one second contact of a capacitor C of a volatile memory cell (e.g., contacts 126b and 126c, respectively) may be connected with an insulating material 122b on the substrate 101. Still referring to FIG. 14, the volatile memory cell VMC may include at least one third contact (e.g., ninth contact 126l) extending in the direction perpendicular to the substrate 101 and connected with one junction (e.g., first junction 123a) of a plurality of junctions of the select transistor TR of the volatile memory cell VMC, and a first conductive pattern (e.g., second conductive pattern 127b) may be connected with a top surface (e.g., 126bU) of the at least one first contact (e.g., contact 126b) and a top surface (e.g., 126lU) of the at least one third contact (e.g., ninth contact 126l). Still referring to FIG. 14, the volatile memory cell VMC may include at least one fourth contact (e.g., eleventh contact 126n) extending in the direction perpendicular to the substrate 101 and connected with the second insulating material 122b, and a second conductive pattern (e.g., second upper conductive pattern 129b) configured to electrically connect the at least one fourth contact (e.g., eleventh contact 126n) with the first conductive pattern (e.g., second conductive pattern 127b).

Figure 15:
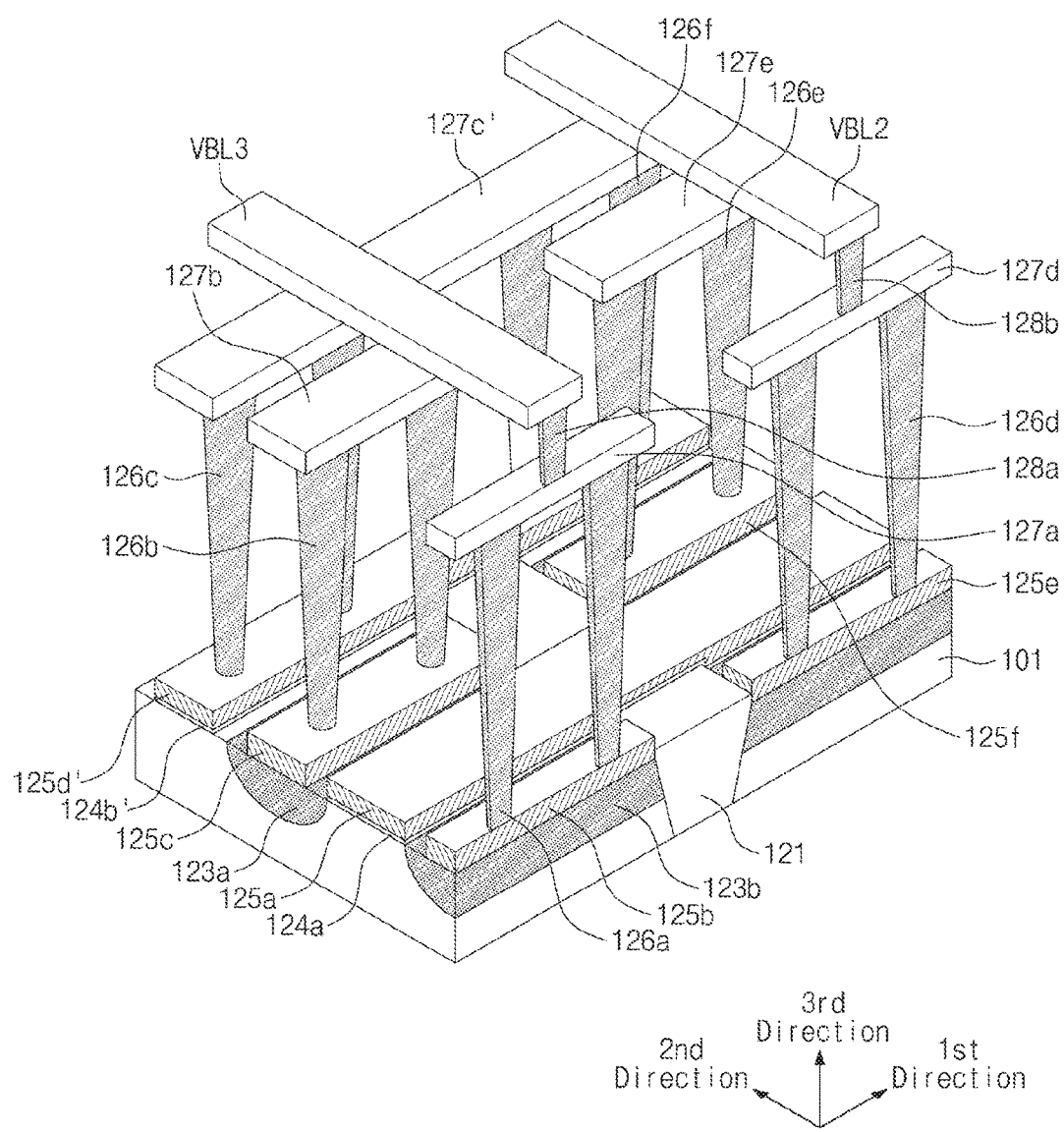
FIG. 15 illustrates an application example of the perspective sectional view of FIG. 4.

FIG. 15 illustrates an application example of the perspective sectional view of FIG. 4. Referring to FIGS. 1 and 15, the second insulating films 124b and 124c are formed integrally with each other in the form of one insulating film 124b' when comparing with FIG. 4. The fourth conductive materials 125d and 125g are formed integrally with each other in the form of one conductive material 125d'. The third conductive patterns 127 and 127f may be formed integrally with one conductive pattern 127c'.

As illustrated in FIG. 15, conductive materials or conductive patterns supplied with the ground voltage may extend in the first direction and formed integrally with each other. If contacts (for example, 126c and 126f) supplied with the ground voltage are electrically connected with each other in a mesh structure, the whole resistance of targets, that is, the conductive material 125d', the conductive pattern 127c', and contacts 126c and 126f supplied with the ground voltage are more reduced. Accordingly, the ground voltage may be more stabilized.

According to the embodiments of the inventive concepts, on the basis that the lengths (or heights) of contacts are increased due to the difference in height between the first memory cell array 110a and the second memory cell array 120a, the second memory cell array 120a including volatile memory cells (VMC) employing contacts for a capacitor may be implemented together with the first memory cell array 110a including the non-volatile memory cells (MC).

FIG. 16 is a block diagram illustrating a semiconductor memory 100 including first and second memory cell arrays 110 and 120. Referring to FIG. 16, the semiconductor memory 100 includes the first memory cell array 110, the second memory cell array 120, a first decoder 131, a page buffer 132, a first control logic 134, a global buffer 133, a second decoder 141, a write driver and sense amplifier 142, a data buffer 143, and a second control logic 144.

The separate, respective memory cells of the first memory cell array 110 may be connected with the first decoder 131 through separate, respective word lines WL and connected with the page buffer 132 through separate, respective bit lines BL. The first memory cell array 110 may include the first memory cell array 110a described with reference to FIGS. 1 to 3.

The separate, respective memory cells of the second memory cell array 120 may be connected with the second decoder 141 through separate, respective volatile word lines VWL and connected with the write driver and sense amplifier 142 through separate, respective volatile bit lines VBL.

The second memory cell array 120 may include the second memory cell array 120a described with reference to FIGS. 1 to 15. In some example embodiments, the respective volatile bit lines VBL are connected with separate, respective bit lines BL, and the write driver and sense amplifier 142 and the page buffer 132 may be collectively configured to alternately access the plurality of memory cells of the first memory cell array 110 and the plurality of memory cells of the second memory cell array 120.

The first decoder 131 may receive an address ADDR from the global buffer 133. The first decoder 131 may decode the address ADDR under the control of the first control logic 134 and may control voltages supplied to the word lines WL depending on the decoded address.

The page buffer 132 is connected with the first memory cell array 110 through the bit lines BL and is connected with the global buffer 133 through data lines DL. The page buffer 132 may operate under the control of the first control logic 134. The page buffer 132 may write data, which is received from the global buffer 133, into the first memory cell array 110. The page buffer 132 may read data from the first memory cell array 110 and may send the read data to the global buffer 133.

The global buffer 133 may exchange data DATA with an external device. The data DATA may aim at being sent to the first memory cell array 110 (for example, when being written) or may be derived from the first memory cell array 110 (for example, when being read).

The global buffer 133 may exchange data DATA with the page buffer 132. The global buffer 133 may receive a command CMD and an address ADDR from the external device. The global buffer 133 may send the command CMD to the first control logic 134 and may send the address ADDR to the first decoder 131.

The first control logic 134 may receive control signals CTRL from an external device. The first control logic 134 may control operations, such as a write operation, a read operation, an erase operation, or a background operation, associated with the first memory cell array 110 in response to the control signals CTRL. The first control logic 134 may control the global buffer 133 to communicate with the external device in response to the control signals CTRL.

The second decoder 141 may receive a volatile address VADDR from the second control logic 144. The second decoder 141 may decode the volatile address VADDR under the control of the second control logic 144 and may control voltages supplied to volatile word lines VWL depending on the decoded volatile address VADDR.

The write driver and sense amplifier 142 is connected with the second memory cell array 120 through volatile bit lines VBL and connected with the data buffer 143 through data lines VDL. The write driver and sense amplifier 142 may operate under the control of the second control logic 144.

The write driver and sense amplifier 142 may write volatile data VDATA, which is received from the data buffer 143, into the second memory cell array 120. The write driver and sense amplifier 142 may read data from the second memory cell array 120 and may send the read volatile data to the data buffer 143.

The data buffer 143 may exchange the volatile data VDATA with the external device. The volatile data VDATA may aim at being sent to the second memory cell array 120 (for example, when being written) or may be derived from the second memory cell array 120 (for example, when being read).

The second control logic 144 may receive a volatile control signal VCTRL, a volatile command VCMD, and a volatile address VADDR from an external device. The second control logic 144 may control operations, such as a write operation, a read operation, an erasing operation, or a background operation associated with the second memory cell array 120 in response to the volatile control signals VCTRL. The second control logic 144 may control the data buffer 143 to communicate with the external device in response to volatile control signals VCTRL.

The external device may independently access the first memory cell array 110 and the second memory cell array 120. In other words, the semiconductor memory 100 may be used as a hybrid memory having both the non-volatile memory cells of the first memory cell array 110 and the volatile memory cells of the second memory cell array 120.

Figure 17:
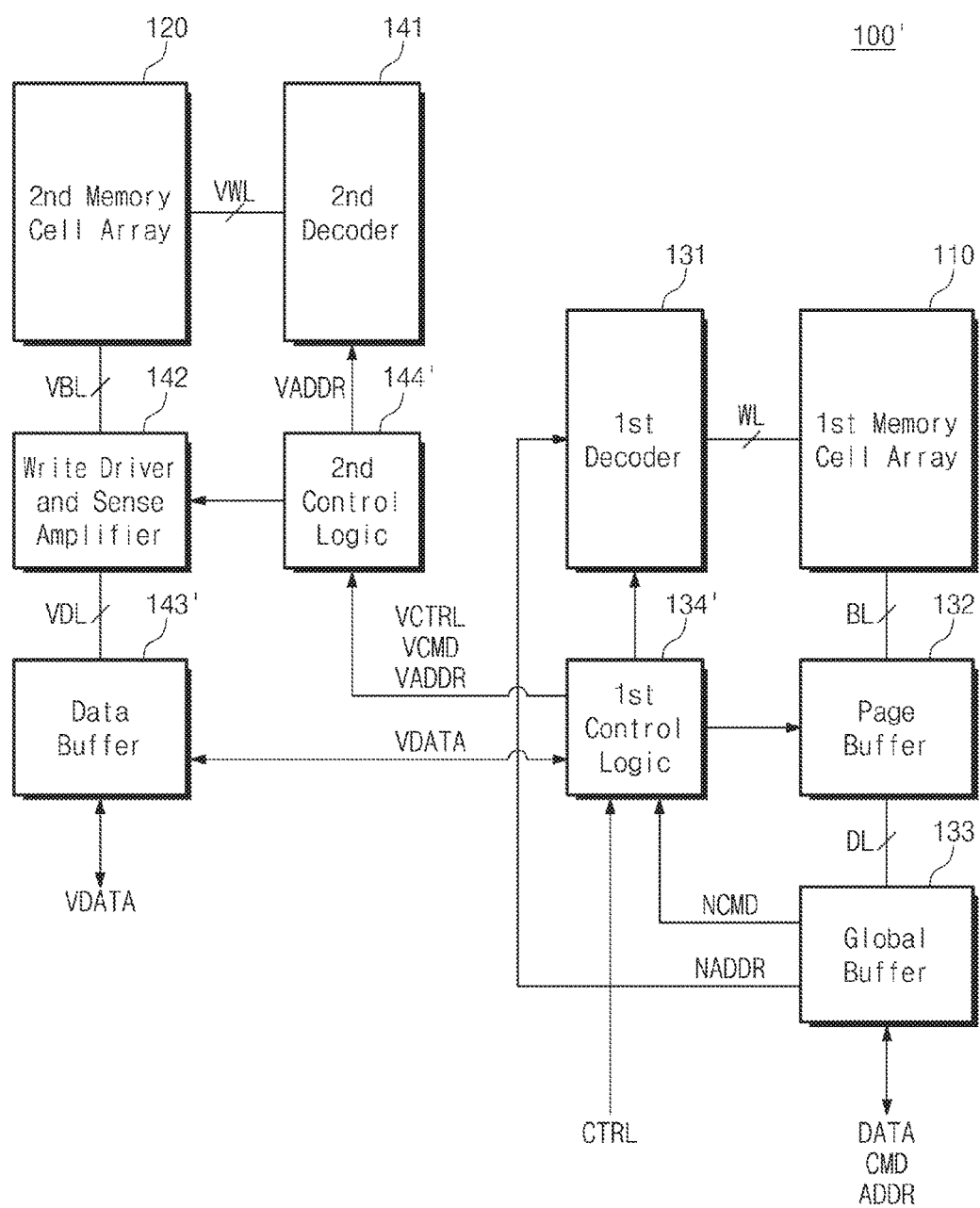
FIG. 17 illustrates an application example of the semiconductor memory of FIG. 16.

FIG. 17 illustrates an application example of the semiconductor memory 100 of FIG. 16. Referring to FIG. 17, a semiconductor memory 100' includes the first memory cell array 110, the second memory cell array 120, the first decoder 131, the page buffer 132, a first control logic 134', the global buffer 133, the second decoder 141, the write driver and sense amplifier 142, a data buffer 143', and a second control logic 144'.

When comparing FIG. 16, the data buffer 143' of the semiconductor memory 100' may exchange volatile data VDATA with the first control logic 134'. The second control logic 144' may receive volatile control signals VCTRL, a volatile command VCMD, and a volatile address VADDR from the first control logic 134'.

The semiconductor memory 100' may be used as a non-volatile memory including the non-volatile memory of the first memory cell array 110. The first control logic 134' may store various types of information necessary for driving the semiconductor memory 100' into the second memory cell array 120. For example, the second memory cell array 120 may be used as the operation memory of the first control logic 134'.

For another example, the data buffer 143' may be modified to exchange volatile data VDATA with the page buffer 132 or the global buffer 133. The first control logic 134' may employ the second memory cell array 120 as a data buffer, a cache memory, or the like. In addition, the first control logic 134' may store a parity derived from data or a parity exchanged from data into the second memory cell array 120.

Figure 18:
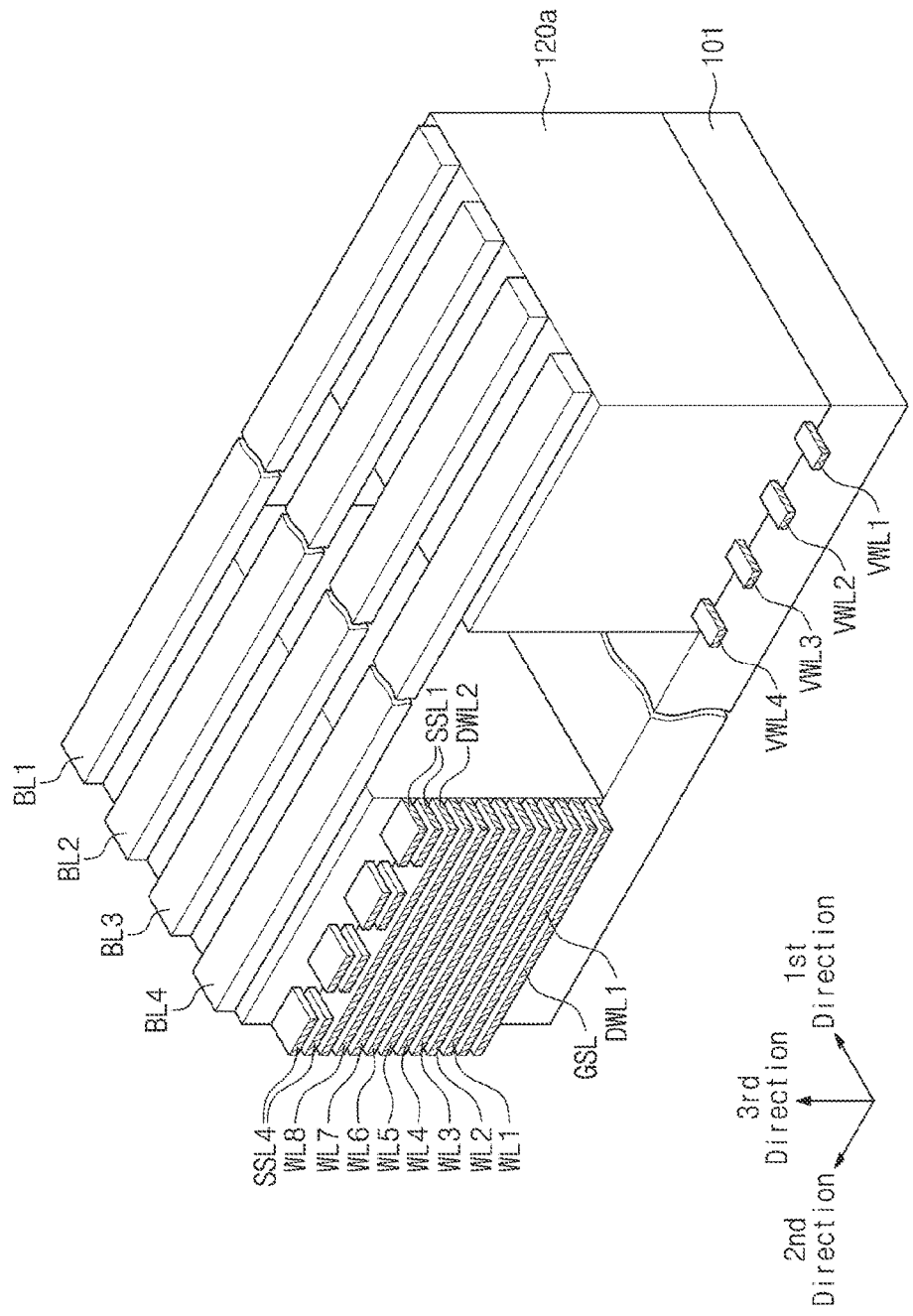
FIG. 18 illustrates an application example of FIG. 1.

FIG. 18 illustrates an application example of FIG. 1. Referring to FIG. 18, a first memory cell array 110a and a second memory cell array 120a are formed on the same substrate 101 in first to third directions. When comparing with FIG. 1, the bit lines BL1 to BL4 are connected with the volatile bit lines VBL1 to VBL4 and thus integrated into first to fourth bit lines BL1 to BL4.

Figure 19:
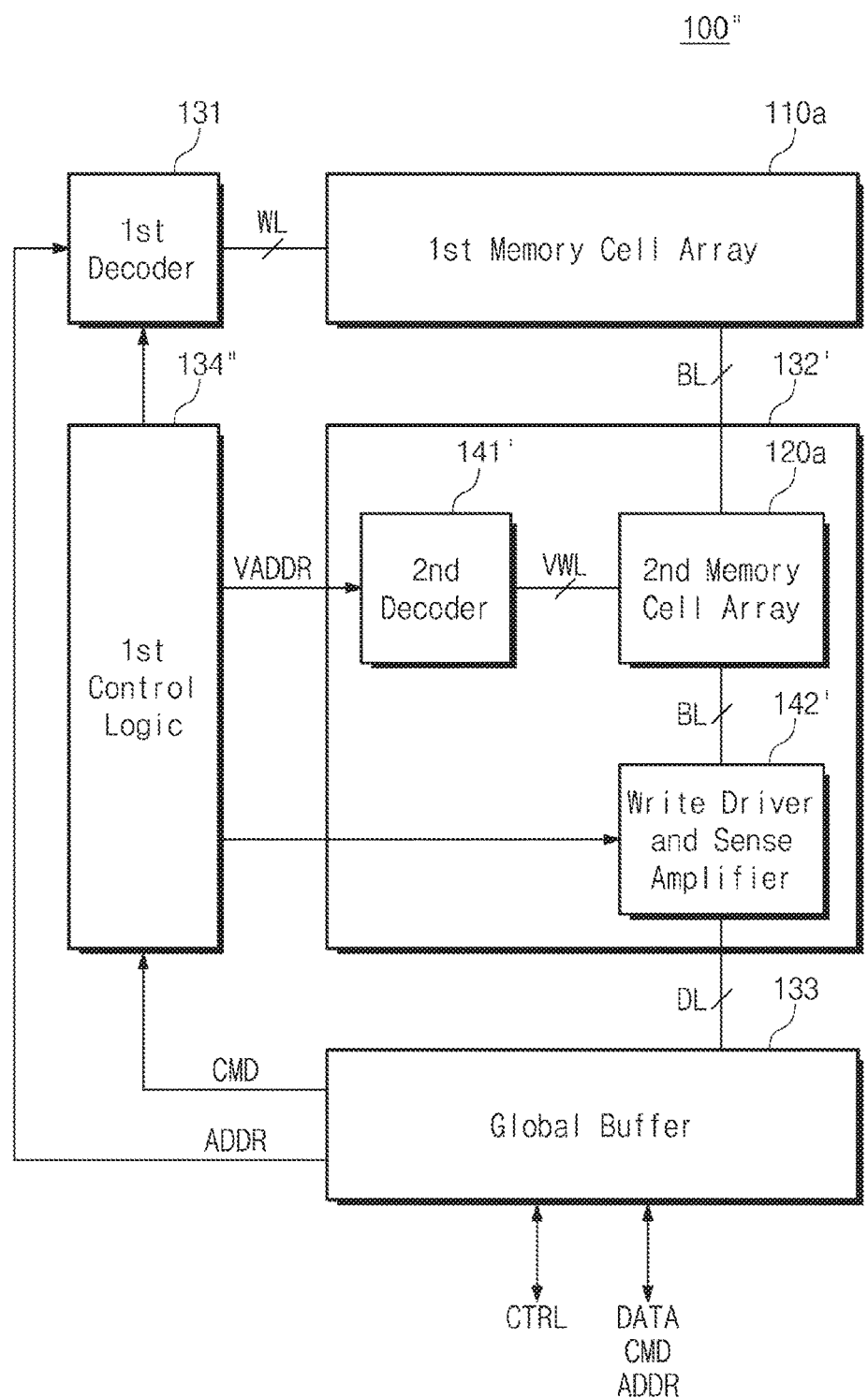
FIG. 19 is a block diagram illustrating a semiconductor memory including the first memory cell array and the second memory cell array of FIG. 18.

FIG. 19 is a block diagram illustrating a semiconductor memory 100" including the first memory cell array 110a and the second memory cell array 120a of FIG. 18. Referring to FIG. 19, the semiconductor memory 100" includes the first memory cell array 110a, a first decoder 131, a page buffer 132', a global buffer 133, and a first control logic 134". The page buffer 132' includes the second memory cell array 120a, a second decoder 141' and a write driver and sense amplifier 142'.

When comparing with FIG. 16, the second memory cell array 120a, the second decoder 141', and the write driver and sense amplifier 142' are included in the page buffer 132'. The first memory cell array 110a is connected with the second memory cell array 120a through bit lines BL. The bit lines BL may be connected to the write driver and sense amplifier 142' through the second memory cell array 120a.

The first control logic 134" may provide a volatile address VADDR to the second decoder 141'. The first control logic 134" may control the write driver and sense amplifier 142' first control logic to perform a write operation, a read operation, or an erase operation with respect to the first memory cell array 110a or the second memory cell array 120a through the bit lines BL.

The first control logic 134" may control the write driver and sense amplifier 142' to exchange data with the global buffer 133 through data lines DL. For example, the second memory cell array 120a may be used as a buffer memory in the page buffer 132'.

The write driver and sense amplifier 142' may store data, which are received from the global buffer 133 through data lines DL, into the second memory cell array 120a. The write driver and sense amplifier 142' may perform a write operation into the first memory cell array 110a, based on data stored in the second memory cell array 120a.

The write driver and sense amplifier 142' may perform a read operation from the first memory cell array 110 and may store the read data into the second memory cell array 120. The write driver and sense amplifier 142' may read data stored in the second memory cell array 120 and may output the read data through the data lines.

According to the inventive concepts, the first memory cells are stacked in the 3D structure and the second memory cells are provided in which contacts extending due to the height difference are used for a storage capacitor. Accordingly, there are provided the semiconductor memory including heterogeneous memory cells provided based on the difference in height between the core region and the peripheral region and the method for the same.

While the inventive concepts has been described with reference to example embodiments thereof, it will be apparent to those of ordinary skill in the art that various changes and modifications may be made thereto without departing from the spirit and scope of the inventive concepts as set forth in the following claims.

What is claimed is:

1. A semiconductor memory, comprising:
    a first memory cell array on a first region of a substrate, the first memory cell array including a plurality of cell strings, each cell string of the plurality of cell strings including a plurality of non-volatile memory cells, the plurality of non-volatile memory cells stacked in a direction perpendicular to the substrate; and
    a second memory cell array on a second region of the substrate, the second memory cell array including a plurality of volatile memory cells, each volatile memory cell of the plurality of volatile memory cells including a select transistor and a capacitor, the capacitor including
        at least one first contact electrically connected with the select transistor of the volatile memory cell, the at least one first contact having a second height corresponding to a first height of each cell string of the plurality of cell strings, and
        at least one second contact configured to be supplied with a ground voltage, the at least one second contact having a third height corresponding to the first height of each cell string of the plurality of cell strings, the at least one second contact adjacent to the at least one first contact of the volatile memory cell, the at least one second contact electrically disconnected with the at least one first contact of the volatile memory cell.

2. The semiconductor memory of claim 1, wherein
the capacitor includes a plurality of first contacts, and
the capacitor further includes a conductive pattern on respective top surfaces of the plurality of first contacts, such that the conductive pattern is configured to connect the plurality of first contacts with each other.

3. The semiconductor memory of claim 2, wherein
at least two volatile memory cells of the plurality of volatile memory cells include respective select transistors having respective gates, the respective gates connected with a common word line, such that the respective gates are connected to each other via the common word line, and
the at least two volatile memory cells include respective conductive patterns, the respective conductive patterns isolated from direct contact with each other.

4. The semiconductor memory of claim 1, wherein
the capacitor includes a plurality of first contacts, and
the capacitor further includes a conductive pattern between respective bottom surfaces of the plurality of first contacts and the substrate, such that the conductive pattern connects the plurality of first contacts with each other.

5. The semiconductor memory of claim 1, wherein
the capacitor includes a plurality of second contacts,
the capacitor further includes a conductive pattern between respective bottom surfaces of the plurality of second contacts and the substrate, the conductive pattern configured to connect the plurality of second contacts with each other, and
the capacitor further includes an insulating material between the respective bottom surfaces of the plurality of second contacts and the substrate, the insulating material configured to insulate the conductive pattern from the substrate.

6. The semiconductor memory of claim 1, wherein
the capacitor includes a plurality of second contacts,
the capacitor of further includes a conductive pattern on respective top surfaces of the plurality of second contacts, such that the conductive pattern is configured to connect the plurality of second contacts with each other,
at least two volatile memory cells of the plurality of volatile memory cells include respective select transistors having respective gates, the respective gates connected with a common word line, such that the respective gates are connected to each other via the common word line, and
the at least two volatile memory cells include respective conductive patterns, the respective conductive patterns connected with each other.

7. The semiconductor memory of claim 1, wherein the at least one first contact extends in the direction perpendicular to the substrate and is connected with a first junction of the select transistor.

8. The semiconductor memory of claim 7, wherein each volatile memory cell of the plurality of volatile memory cells further includes at least one third contact extending in the direction perpendicular to the substrate, the at least one third contact connected with a second junction of the select transistor of the volatile memory cell.

9. The semiconductor memory of claim 8, wherein
the plurality of volatile memory cells includes at least two volatile memory cells that are symmetrical to each other,
the at least two volatile memory cells share a common second junction, and
at least two volatile memory cells share a common third contact.

10. The semiconductor memory of claim 7, wherein
each volatile memory cell of the plurality of volatile memory cells further includes at least one third contact extending in the direction perpendicular to the substrate, the at least one third contact connected with a second junction in the substrate,
the at least one second contact is between the at least one first contact and the at least one third contact, and
the substrate includes a deep junction including the first junction and the second junction.

11. The semiconductor memory of claim 10, wherein the at least one second contact extends in the direction perpendicular to the substrate and is connected with an insulating material on the deep junction.

12. The semiconductor memory of claim 1, wherein
each volatile memory cell of the plurality of volatile memory cells further includes a control transistor connected between the capacitor of the volatile memory cell and a node configured to be supplied with the ground voltage, and
the at least one second contact extends in the direction perpendicular to the substrate and is connected with one junction of a plurality of junctions of the control transistor of the volatile memory cell.

13. The semiconductor memory of claim 1, wherein the at least one first contact and the at least one second contact extend in the direction perpendicular to the substrate and are connected with an insulating material on the substrate.

14. The semiconductor memory of claim 13, wherein each volatile memory cell of the plurality of volatile memory cells further includes
at least one third contact extending in the direction perpendicular to the substrate and connected with one junction of a plurality of junctions of the select transistor of the volatile memory cell, and
a first conductive pattern connected with a top surface of the at least one first contact of the volatile memory cell and a top surface of the at least one third contact of the volatile memory cell.

15. The semiconductor memory of claim 14, wherein each volatile memory cell of the plurality of volatile memory cells further includes
at least one fourth contact extending in the direction perpendicular to the substrate and connected with the insulating material, and
a second conductive pattern configured to electrically connect the at least one fourth contact with the first conductive pattern of the volatile memory cell.

16. A semiconductor memory comprising:
a memory cell array including a plurality of memory cells, each memory cell of the plurality of memory cells including a select transistor and a capacitor, the capacitor including
at least one first contact extending in a direction perpendicular to a substrate and connected with at least one junction of the select transistor of the memory cell, and
at least one second contact adjacent to the at least one first contact, the at least one second contact configured to be supplied with a ground voltage, the at least one second contact electrically disconnected from the at least one first contact;
a decoder connected with the plurality of memory cells through separate, respective word lines; and a write driver and sense amplifier connected with the plurality of memory cells through respective bit lines.

17. The semiconductor memory of claim 16, further comprising:
a second memory cell array including a plurality of second memory cells, the plurality of second memory cells are included in a plurality of cell strings stacked in the direction perpendicular to the substrate;
a second decoder connected with the plurality of second memory cells through separate, respective second word lines; and
a page buffer connected with the plurality of second memory cells through separate, respective second bit lines,
wherein respective heights of the at least one first contact and the at least one second contact of each memory cell of the plurality of memory cells are associated with respective heights of the cell strings.

18. The semiconductor memory of claim 17, wherein the respective bit lines are connected with separate, respective second bit lines, and
the write driver and sense amplifier and the page buffer are collectively configured to alternately access the plurality of memory cells and the plurality of second memory cells.

19. The semiconductor memory of claim 18, wherein the memory cell array, the decoder, and the write driver and the sense amplifier are included in the page buffer.

20. A method, comprising:
providing a first memory cell array on a substrate, the providing the first memory cell array including providing a plurality of cell strings on the substrate in a direction perpendicular to the substrate, each cell string including a separate stack of first memory cells of the first memory cell array; and
providing a second memory cell array on the substrate, the providing the second memory cell array including
providing at least one first contact, the at least one first contact having a second height corresponding to a first height of each cell string of the plurality of cell strings,
providing at least one second contact, the at least one second contact having a third height corresponding to the first height of each cell string of the plurality of cell strings,
electrically connecting the at least one first contact with a select transistor, and
electrically connecting the at least one second contact with a ground node.

* * * * *